United States Patent
Alvarez-Icaza Rivera et al.

(10) Patent No.: US 9,940,302 B2
(45) Date of Patent: *Apr. 10, 2018

(54) INTERCONNECT CIRCUITS AT THREE DIMENSIONAL (3-D) BONDING INTERFACES OF A PROCESSOR ARRAY

(71) Applicant: INTERNATIONAL BUSINESS MACHINES CORPORATION, Armonk, NY (US)

(72) Inventors: Rodrigo Alvarez-Icaza Rivera, San Jose, CA (US); John V. Arthur, Mountain View, CA (US); John E. Barth, Jr., Williston, VT (US); Andrew S. Cassidy, San Jose, CA (US); Subramanian S. Iyer, Mount Kisco, NY (US); Bryan L. Jackson, Fremont, CA (US); Paul A. Merolla, Palo Alto, CA (US); Dharmendra S. Modha, San Jose, CA (US); Jun Sawada, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 25 days.

This patent is subject to a terminal disclaimer.

(21) Appl. No.: 15/133,097

(22) Filed: Apr. 19, 2016

(65) Prior Publication Data

US 2016/0232128 A1 Aug. 11, 2016

Related U.S. Application Data

(63) Continuation of application No. 13/781,497, filed on Feb. 28, 2013, now Pat. No. 9,368,489.

(51) Int. Cl.
*G06F 15/80* (2006.01)
*H01L 27/06* (2006.01)
(Continued)

(52) U.S. Cl.
CPC ........ *G06F 15/803* (2013.01); *H01L 21/8221* (2013.01); *H01L 23/50* (2013.01);
(Continued)

(58) Field of Classification Search
CPC ....... H01L 2224/32145; H01L 2924/00; H01L 21/8221; H01L 23/50; H01L 27/0688;
(Continued)

(56) References Cited

U.S. PATENT DOCUMENTS 5,937,202 A 8/1999 Crosetto
7,701,252 B1 4/2010 Chow et al.
(Continued)

FOREIGN PATENT DOCUMENTS

EP 1775897 B1 1/2010
WO 2008041069 A2 4/2008

OTHER PUBLICATIONS

Patti, R.S., "Three-Dimensional Integrated Circuits and the Future of System-on-Chip Designs", Proceedings of the IEEE, Jun. 2006, pp. 1214-1224, vol. 94, No. 6, IEEE, USA.
(Continued)

*Primary Examiner* — Bac Au
(74) *Attorney, Agent, or Firm* — Sherman IP LLP; Kenneth L. Sherman; Hemavathy Perumal

(57) ABSTRACT

Embodiments of the invention relate to processor arrays, and in particular, a processor array with interconnect circuits for bonding semiconductor dies. One embodiment comprises multiple semiconductor dies and at least one interconnect circuit for exchanging signals between the dies. Each die comprises at least one processor core circuit. Each interconnect circuit corresponds to a die of the processor array. Each interconnect circuit comprises one or more attachment pads for interconnecting a corresponding die with another die,
(Continued)

and at least one multiplexor structure configured for exchanging bus signals in a reversed order.

20 Claims, 21 Drawing Sheets

(51) Int. Cl.
    *H01L 23/50*     (2006.01)
    *H01L 21/822*     (2006.01)
    *H01L 27/11551*     (2017.01)
    *H01L 27/11526*     (2017.01)
    *H01L 27/11578*     (2017.01)
    *H01L 27/02*     (2006.01)
    *H01L 27/11573*     (2017.01)
    *H01L 25/065*     (2006.01)

(52) U.S. Cl.
CPC ...... *H01L 25/0652* (2013.01); *H01L 27/0207* (2013.01); *H01L 27/0688* (2013.01); *H01L 27/11526* (2013.01); *H01L 27/11551* (2013.01); *H01L 27/11573* (2013.01); *H01L 27/11578* (2013.01); *H01L 2224/16145* (2013.01); *H01L 2224/32145* (2013.01); *H01L 2224/48227* (2013.01); *H01L 2224/73204* (2013.01); *H01L 2224/73265* (2013.01); *H01L 2225/06513* (2013.01); *H01L 2225/06555* (2013.01); *H01L 2225/06593* (2013.01)

(58) Field of Classification Search
CPC ......... H01L 27/11551; H01L 27/11578; H01L 23/481; G06F 15/803; G06F 13/4022; G06F 13/4068; G06F 15/17387; G06F 15/7825

See application file for complete search history.

(56) References Cited

U.S. PATENT DOCUMENTS

| | | | |
|---|---|---|---|
| 7,791,175 B2 | 9/2010 | Pyeon | |
| 7,913,202 B2 | 3/2011 | Bernstein et al. | |
| 8,140,297 B2 | 3/2012 | Bartley et al. | |
| 8,285,900 B2 | 10/2012 | Gratz | |
| 9,588,937 B2 * | 3/2017 | Alvarez-Icaza Rivera | G06F 15/17387 |
| 2006/0071332 A1 | 4/2006 | Speers | |
| 2010/0140750 A1 | 6/2010 | Toms | |
| 2010/0296256 A1 | 11/2010 | Gillingham et al. | |
| 2012/0146099 A1 | 6/2012 | Geer et al. | |
| 2013/0283005 A1 | 10/2013 | Emma | |
| 2014/0006852 A1 | 1/2014 | Buyuktosunoglu et al. | |
| 2014/0244971 A1 | 8/2014 | Alvarez-Icaza Rivera et al. | |
| 2017/0124024 A1 | 5/2017 | Alvarez-Icaza Rivera et al. | |

OTHER PUBLICATIONS

Koester, S.J. et al., "Wafer-level 3D Integration Technology", IBM Journal of Research and Development, Nov. 2008, pp. 583-591, vol. 52, No. 6, IBM Corporation, USA.

Mineo, C. et al., "Inter-Die Signaling in Three Dimensional Integrated Circuits", Proceedings of the 2008 IEEE Custom Integrated Circuits Conference (CICC '08), Sep. 2008, pp. 655-658, IEEE, USA.

Tayu, S. et al., "The Complexity of Three-Dimensional Channel Routing (Extended Abstract)", Proceedings of the 2007 IEEE International Symposium on Circuits and Systems (ISCAS '07), May 2007, pp. 1-10, IEEE, US.

U.S. Non-Final Office Action for U.S. Appl. No. 13/781,465 dated Oct. 19, 2015.

U.S. Final Office Action for U.S. Appl. No. 13/781,465 dated Feb. 11, 2016.

U.S. Advisory Action for U.S. Appl. No. 13/781,465 dated Apr. 5, 2016.

U.S. Non-Final Office Action for U.S. Appl. No. 13/781,497 dated Sep. 25, 2015.

U.S. Notice of Allowance for U.S. Appl. No. 13/781,497 dated Feb. 17, 2016.

U.S. Notice of Allowance for U.S. Appl. No. 13/781,465 dated Oct. 24, 2016.

U.S. Notice of Allowance for U.S. Appl. No. 15/400,907 dated Jun. 8, 2017.

U.S. Non-Final Office Action for U.S. Appl. No. 13/781,465 dated Jun. 28, 2016.

U.S. Non-Final Office Action for U.S. Appl. No. 15/400,907 dated Mar. 9, 2017.

* cited by examiner

INTERCONNECT CIRCUITS AT THREE DIMENSIONAL (3-D) BONDING INTERFACES OF A PROCESSOR ARRAY

This invention was made with Government support under HR0011-09-C-0002 awarded by Defense Advanced Research Projects Agency (DARPA). The Government has certain rights in this invention.

BACKGROUND

Embodiments of the invention relate to processor arrays, and in particular, a processor array with interconnect circuits for bonding semiconductor dies.

A processor array contains and manages multiple processing elements. There are different types of processing elements, such as microprocessors, microcontrollers, digital signal processors, graphics processors, reconfigurable processors, fixed function units, hardware accelerators, neurosynaptic neural core circuits, etc. A processor array may include different types of processing elements. The processing elements may be arranged in a one-dimensional array, a two-dimensional array, or a three-dimensional array, or a ring or torus topology. The processing elements are interconnected by a routing system including buses and switches. Packets are communicated between processing elements using the routing system.

BRIEF SUMMARY

Embodiments of the invention relate to processor arrays, and in particular, a processor array with interconnect circuits for bonding semiconductor dies. One embodiment comprises multiple semiconductor dies and at least one interconnect circuit for exchanging signals between the dies. Each die comprises at least one processor core circuit. Each interconnect circuit corresponds to a die of the processor array. Each interconnect circuit comprises one or more attachment pads for interconnecting a corresponding die with another die, and at least one multiplexor structure configured for exchanging bus signals in a reversed order.

Another embodiment of the invention comprises exchanging signals between multiple semiconductor dies via at least one interconnect circuit. Each die comprises at least one processor core circuit. Each interconnect circuit corresponds to a die of the processor array. Each interconnect circuit comprises one or more attachment pads for interconnecting a corresponding die with another die, and at least one multiplexor structure configured for exchanging bus signals in a reversed order.

These and other features, aspects and advantages of the present invention will become understood with reference to the following description, appended claims and accompanying figures.

DETAILED DESCRIPTION

Embodiments of the invention relate to processor arrays, and in particular, a processor array with interconnect circuits for bonding semiconductor dies. One embodiment comprises multiple semiconductor dies and at least one interconnect circuit for exchanging signals between the dies. Each die comprises at least one processor core circuit. Each interconnect circuit corresponds to a die of the processor array. Each interconnect circuit comprises one or more attachment pads for interconnecting a corresponding die with another die, and at least one multiplexor structure configured for exchanging bus signals in a reversed order.

Another embodiment of the invention comprises exchanging signals between multiple semiconductor dies via at least one interconnect circuit. Each die comprises at least one processor core circuit. Each interconnect circuit corresponds to a die of the processor array. Each interconnect circuit comprises one or more attachment pads for interconnecting a corresponding die with another die, and at least one multiplexor structure configured for exchanging bus signals in a reversed order.

For each interconnect circuit corresponding to a die, one or more attachment pads are positioned substantially symmetrical on the die, wherein the attachment pads interconnect the die with another die that is either identical to or different from the die.

For each interconnect circuit, at least one attachment pad of the interconnect circuit connects a core circuit of a corresponding die with another core circuit of another die.

For each interconnect circuit, at least one attachment pad of the interconnect circuit connects a switching circuit of a corresponding die with another switching circuit of another die.

In one embodiment, for each core circuit, the attachment pads interconnecting the core circuit with another core circuit are positioned vertically relative to one another on the core circuit. In another embodiment, for each core circuit, the attachment pads interconnecting the core circuit with another core circuit are positioned horizontally relative to one another on the core circuit. In yet another embodiment, for each core circuit, the attachment pads interconnecting the core circuit with another core circuit are positioned along a center axis of the core circuit.

Each multiplexor structure is configured for exchanging signals in a reversed order based on one or more configuration bits.

For a first die and a second die having different physical orientations, a logical orientation of the first die is reversed to match a logical orientation of the second die by receiving incoming signals in a reversed order and sending outgoing signals in a reversed order.

In one embodiment, a top side of the first die is physically bonded with a top side of the second die. In another embodiment, a bottom side of the first die is physically bonded with a bottom side of the second die.

Figure 1A:
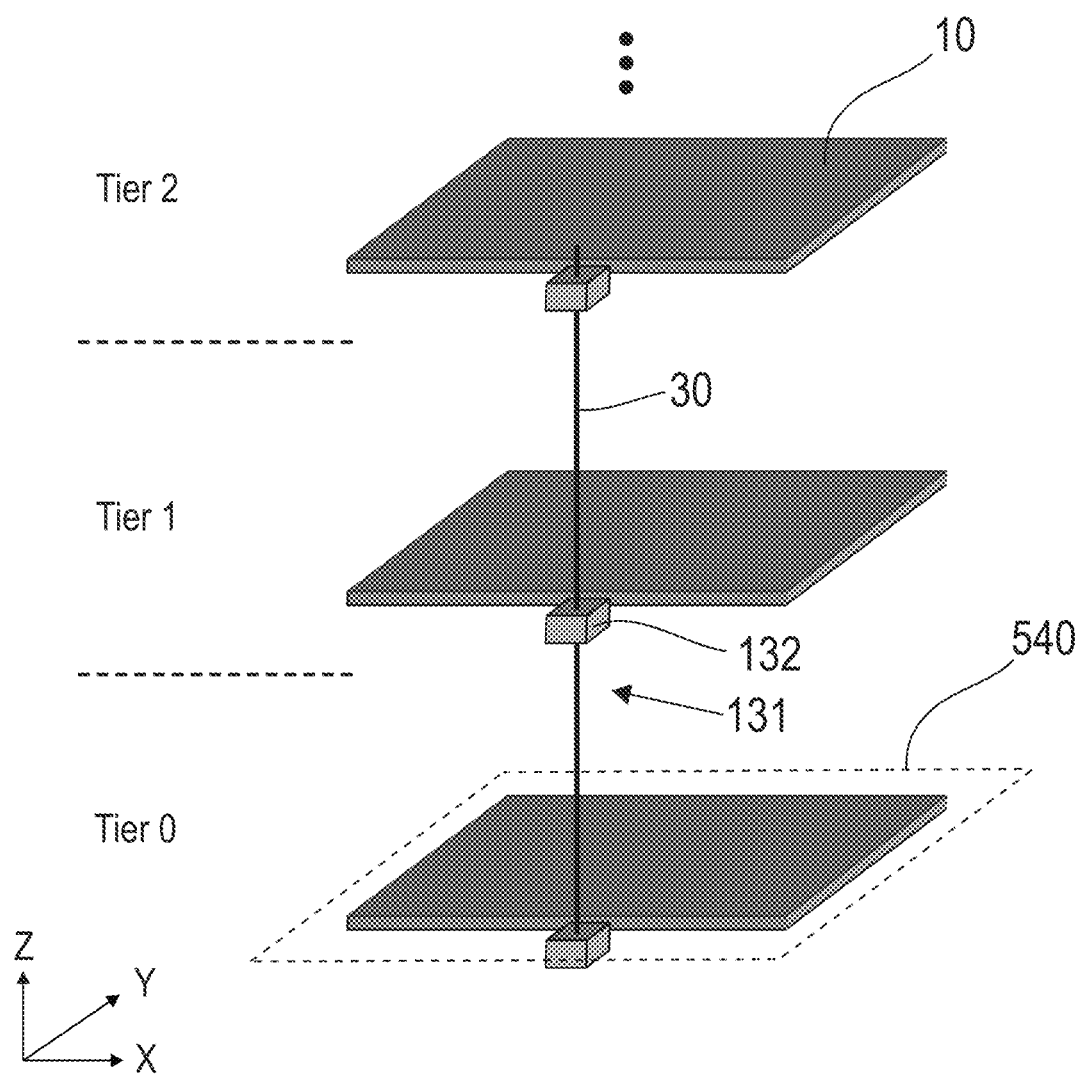
FIG. 1A illustrates a one-dimensional (1-D) array of processor core circuits, in accordance with an embodiment of the invention.

FIG. 1A illustrates a one-dimensional (1-D) array 130 of processor core circuits 10, in accordance with an embodiment of the invention. A processor core circuit 10 is a processing element for executing instructions and processing data (e.g., generating data, consuming data, transforming data, evaluating data, storing data, retrieving data, etc.). Multiple core circuits 10 may be arranged into an N-dimensional array (e.g., a 1-D array or a multi-dimensional array), wherein N is a positive integer. The N-dimensional array is implemented in three-dimensional very-large-scale integration (3D VLSI). For example, as shown in FIG. 1A, multiple core circuits 10 may be organized into a one-dimensional (1-D) array 130 implemented in 3D VLSI.

The array 130 includes multiple reversible tiers 540, such as Tier 0, Tier 1, and Tier 2. Each tier 540 of the array 130 includes a core circuit 10. The array 130 further comprises a routing system 131 for routing packets between the core circuits 10 in different tiers 540. In one embodiment, the routing system 131 includes multiple 1-D switches (i.e., routers) 132 and multiple data paths (i.e., buses) 30. Each switch 132 corresponds to at least one core circuit 10 of the array 130. Each switch 132 is interconnected with a corresponding core circuit 10 via at least one data path 30. Each switch 132 is further interconnected with at least one adjacent neighboring switch 132 via at least one data path 30.

In one embodiment, each core circuit 10 of the array 130 utilizes a corresponding switch 132 to pass along packets including information to core circuits 10 in different tiers 540 in multiple directions, such as a first Z direction with increasing Z coordinates ("Z+ direction"), and a second Z direction with decreasing Z coordinates ("Z− direction"). Z routing (i.e., routing packets in the Z+ direction or the Z− direction) interconnects switches 132 in different tiers 540.

Figure 1B:
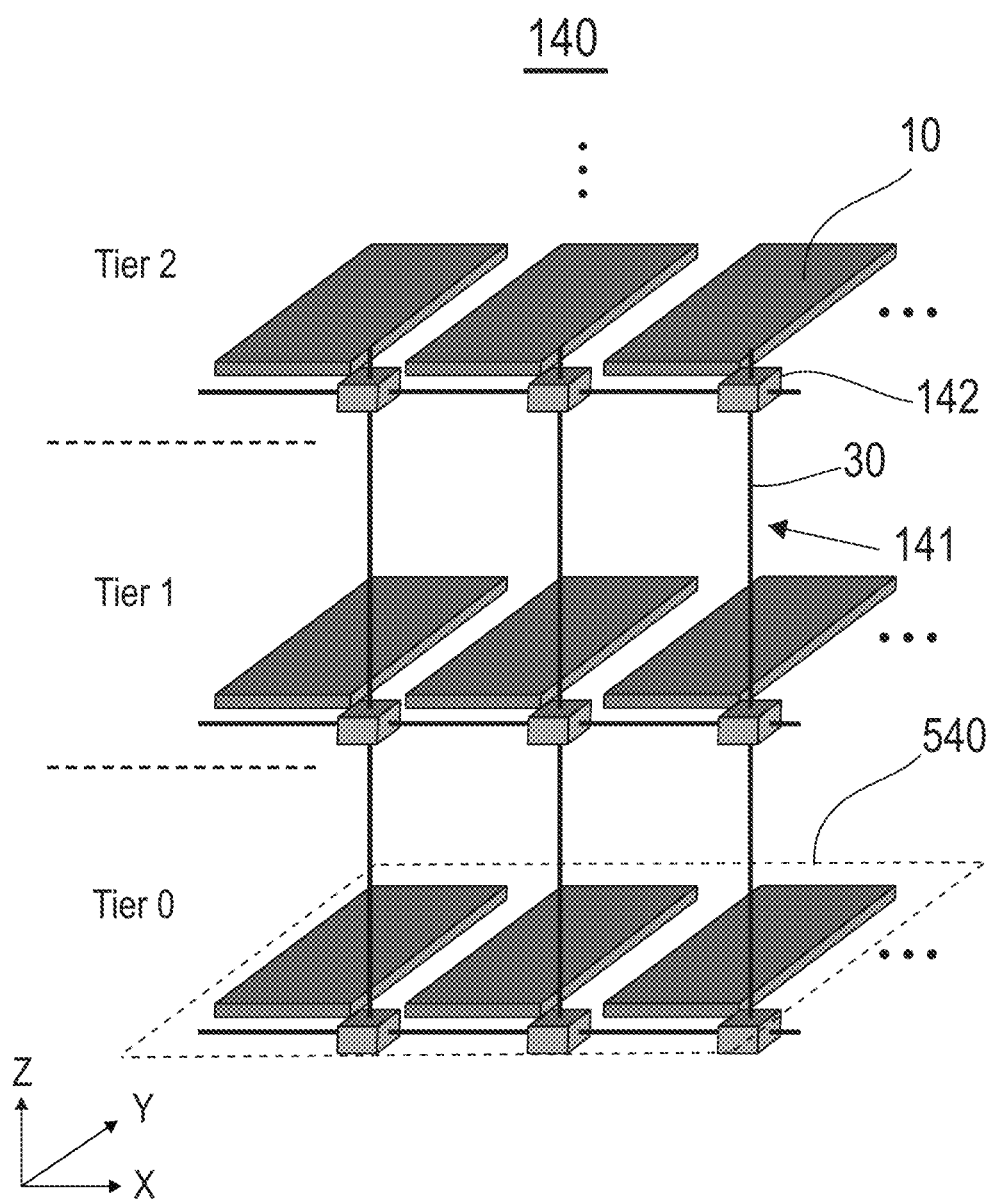
FIG. 1B illustrates a two-dimensional (2-D) array of processor core circuits, in accordance with an embodiment of the invention.

FIG. 1B illustrates a two-dimensional (2-D) array 140 of processor core circuits 10, in accordance with an embodiment of the invention. In one embodiment, multiple core circuits 10 may be organized into a two-dimensional (2-D) array 140 implemented in 3D VLSI, as shown in FIG. 1B.

The array 140 includes multiple reversible tiers 540, such as Tier 0, Tier 1, and Tier 2. Each tier 540 of the array 140 includes at least one core circuit 10. The array 140 further comprises a routing system 141 for routing packets between the core circuits 10. In one embodiment, the routing system 141 includes multiple 2-D switches (i.e., routers) 142 and multiple data paths (i.e., buses) 30. Each switch 142 corresponds to at least one core circuit 10 of the array 140. Each switch 142 is interconnected with a corresponding core circuit 10 via at least one data path 30. Each switch 142 is further interconnected with at least one adjacent neighboring switch 142 via at least one data path 30.

In one embodiment, each core circuit 10 of the array 140 utilizes a corresponding switch 142 to pass along packets including information to core circuits 10 in multiple directions, such as a first X direction with increasing X coordinates ("X+ direction"), a second X direction with decreasing X coordinates ("X− direction"), a first Z direction with increasing Z coordinates ("Z+ direction"), and a second Z direction with decreasing Z coordinates ("Z− direction"). Z routing (i.e., routing packets in the Z+ direction or the Z− direction) interconnects switches 142 in different tiers 540. X routing (i.e., routing packets in the X+ direction or the X− direction) interconnects switches 142 within the same tier 540.

Figure 1C:
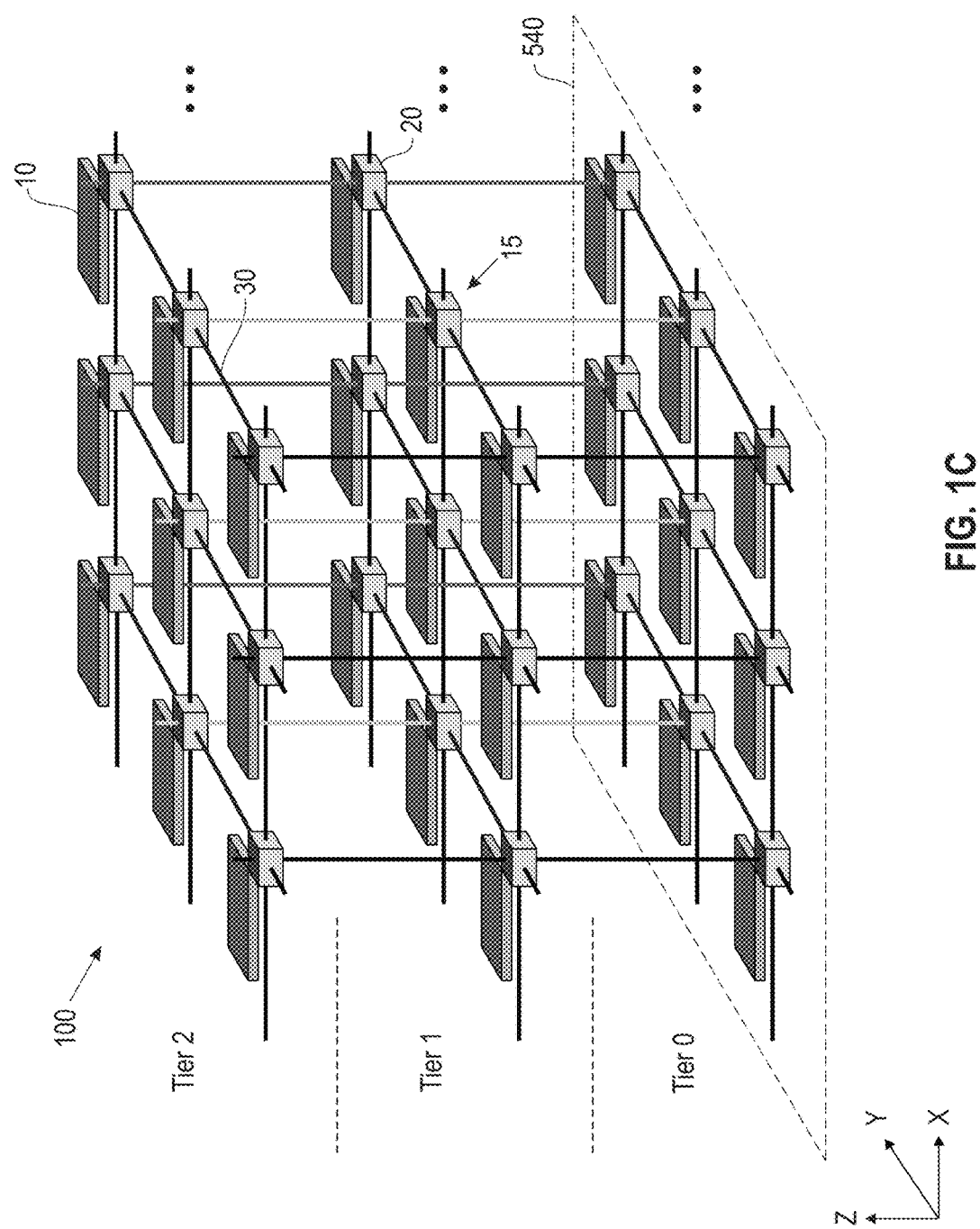
FIG. 1C illustrates a three-dimensional (3-D) array of processor core circuits, in accordance with an embodiment of the invention.

FIG. 1C illustrates a three-dimensional (3-D) array 100 of processor core circuits 10, in accordance with an embodiment of the invention. In one embodiment, multiple core circuits 10 may be organized into a 3-D array 100 implemented in 3D VLSI, as shown in FIG. 1C.

The 3-D array 100 includes multiple reversible tiers 540, such as Tier 0, Tier 1, and Tier 2. Each tier 540 includes at least one core circuit 10. The 3-D array 100 further comprises a routing system 15 for routing packets between the core circuits 10. The routing system 15 includes multiple switches (i.e., routers) 20 and multiple data paths (i.e., buses) 30. Each switch 20 corresponds to at least one core circuit 10 of the 3-D array 100. Each switch 20 is interconnected with a corresponding core circuit 10 via at least one data path 30. Each switch 20 is further interconnected with at least one adjacent neighboring switch 20 via at least one data path 30.

In one embodiment, each core circuit 10 utilizes a corresponding switch 20 to pass along packets including information to other core circuits 10 in multiple directions, such as a first X direction with increasing X coordinates ("X+ direction"), a second X direction with decreasing X coordinates ("X− direction"), a first Y direction with increasing Y coordinates ("Y+ direction"), a second Y direction with decreasing Y coordinates ("Y− direction"), a first Z direction with increasing Z coordinates ("Z+ direction"), and a second Z direction with decreasing Z coordinates ("Z− direction"). Z routing (i.e., routing packets in the Z+ direction or the Z− direction) interconnects switches 20 in different tiers 540. X-Y routing (i.e., routing packets in the X+ direction, the X− direction, the Y+ direction, or the Y− direction) interconnects switches 20 within the same tier 540.

Figure 2:
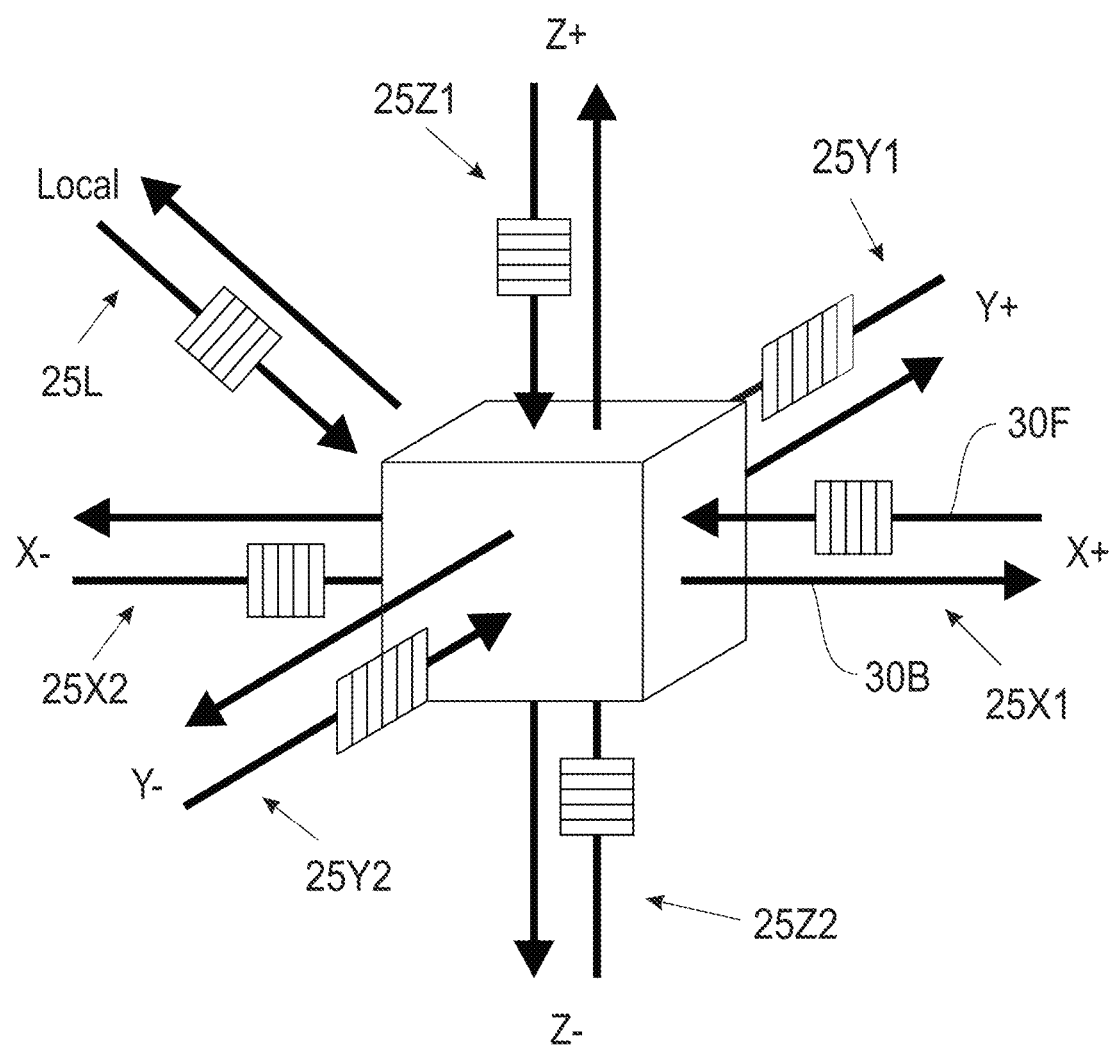
FIG. 2 illustrates an example configuration of a switch in FIG. 1, wherein the switch is a 3-D switch, in accordance with an embodiment of the invention.

FIG. 2 illustrates an example configuration of a switch 20 in FIG. 1, wherein the switch 20 is a 3-D switch, in accordance with an embodiment of the invention. In one embodiment, the routing system 15 is a multi-dimensional switch network, wherein each switch 20 is a 3-D switch.

In one embodiment, each switch 20 exchanges packets with neighboring components (i.e., adjacent switches 20, a corresponding core circuit 10) via multiple sets of router channels, wherein each set of router channels has an incoming router channel 30F and a reciprocal router channel 30B. Specifically, a first set 25L of router channels ("Local router channels") interconnects the switch 20 with a corresponding core circuit 10. The switch 20 receives packets from the corresponding core circuit 10 via an incoming router channel 30F of the set 25L and sends packets to the corresponding core circuit 10 via an outgoing router channel 30B of the set 25L.

A second set 25X1 of router channels ("X+ router channels") interconnects the switch 20 with a neighboring switch 20 in the X+ direction. The switch 20 receives packets from the neighboring switch 20 in the X+ direction via an incoming router channel 30F of the set 25X1 and sends packets to the neighboring switch 20 in the X+ direction via an outgoing router channel 30B of the set 25X1.

A third set 25X2 of router channels ("X− router channels") interconnects the switch 20 with a neighboring switch 20 in the X− direction. The switch 20 receives packets from the neighboring switch 20 in the X− direction via an incoming router channel 30F of the set 25X2 and sends packets to the neighboring switch 20 in the X− direction via an outgoing router channel 30B of the set 25X2.

A fourth set 25Y1 of router channels ("Y+ router channels") interconnects the switch 20 with a neighboring switch 20 in the Y+ direction. The switch 20 receives packets from the neighboring switch 20 in the Y+ direction via an incoming router channel 30F of the set 25Y1 and sends packets to the neighboring switch 20 in the Y+ direction via an outgoing router channel 30B of the set 25Y1.

A fifth set 25Y2 of router channels ("Y− router channels") interconnects the switch 20 with a neighboring switch 20 in the Y− direction. The switch 20 receives packets from the neighboring switch 20 in the Y− direction via an incoming router channel 30F of the set 25Y2 and sends packets to the neighboring switch 20 in the Y− direction via an outgoing router channel 30B of the set 25Y2.

A sixth set 25Z1 of router channels ("Z+ router channels") interconnects the switch 20 with a neighboring switch 20 in the Z+ direction. The switch 20 receives packets from the neighboring switch 20 in the Z+ direction via an incoming router channel 30F of the set 25Z1 and sends packets to the neighboring switch 20 in the Z+ direction via an outgoing router channel 30B of the set 25Z1.

A seventh set 25Z2 of router channels ("Z− router channels") interconnects the switch 20 with a neighboring switch 20 in the Z− direction. The switch 20 receives packets from the neighboring switch 20 in the Z− direction via an incoming router channel 30F of the set 25Z2 and sends packets to the neighboring switch 20 in the Z− direction via an outgoing router channel 30B of the set 25Z2.

Figure 3:
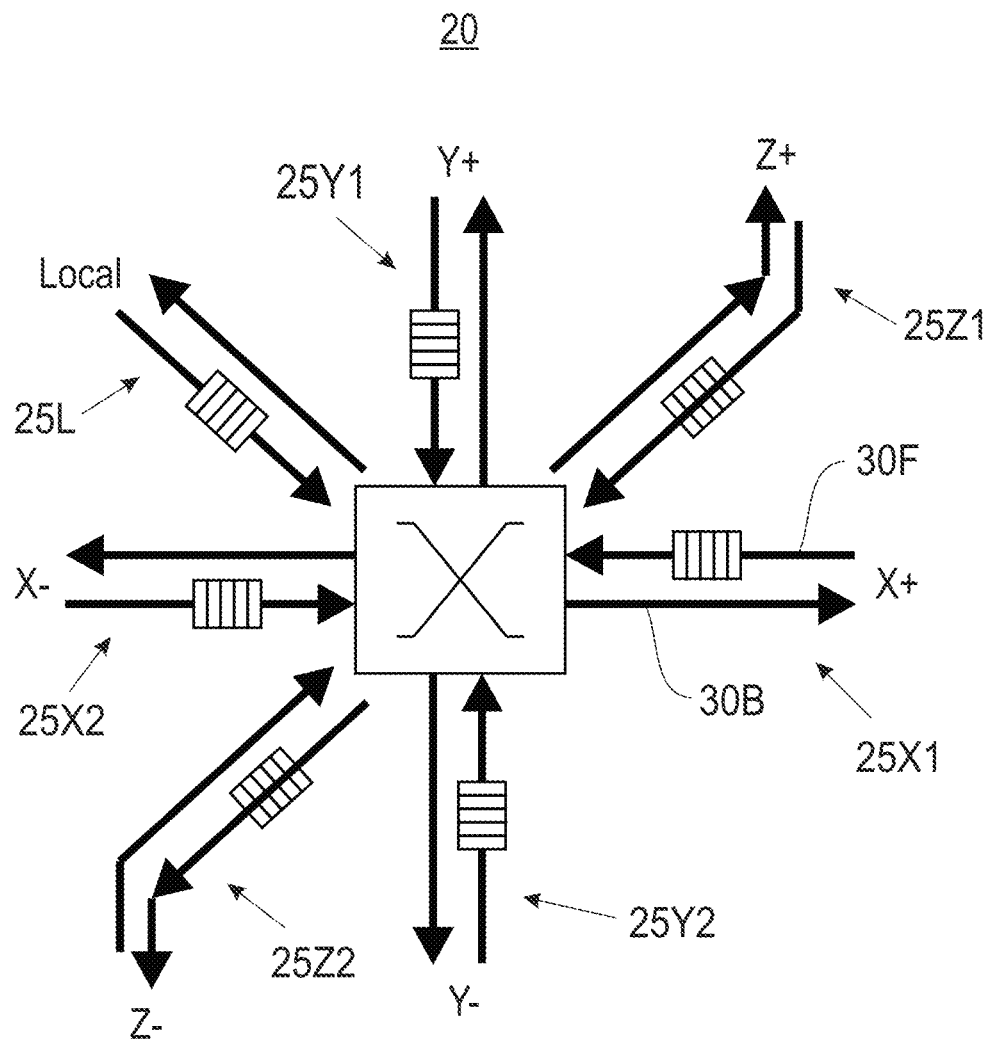
FIG. 3 illustrates another example configuration of a switch in FIG. 1, wherein the 3-D switch is implemented in a two-dimensional (2-D) plane, in accordance with an embodiment of the invention.

In another embodiment, each switch 20 of the routing system 15 is a planar switch 20 implemented in a 2-D plane. FIG. 3 illustrates another example configuration of a switch 20 in FIG. 1, wherein the 3-D switch 20 is implemented in a 2-D plane, in accordance with an embodiment of the invention. Each switch 20 exchanges packets with neighboring components (i.e., adjacent switches 20, a corresponding core circuit 10) via multiple sets of router channels, such as a first set 25L of router channels ("Local router channels") interconnecting the switch 20 with a corresponding core circuit 10, a second set 25X1 of router channels ("X+ router channels") interconnecting the switch 20 with a neighboring switch 20 in the X+ direction, a third set 25X2 of router channels ("X− router channels") interconnecting the switch 20 with a neighboring switch 20 in the X− direction, a fourth set 25Y1 of router channels ("Y+ router channels") interconnecting the switch 20 with a neighboring switch 20 in the Y+ direction, a fifth set 25Y2 of router channels ("Y− router channels") interconnecting the switch 20 with a neighboring switch 20 in the Y− direction, a sixth set 25Z1 of router channels ("Z+ router channels") interconnecting the switch 20 with a neighboring switch 20 in the Z+ direction, and a seventh set 25Z2 of router channels ("Z− router channels") interconnecting the switch 20 with a neighboring switch 20 in the Z− direction. Each set of router channels includes at least one incoming router channel 30F and at least one outgoing router channel 30B.

Figure 4:
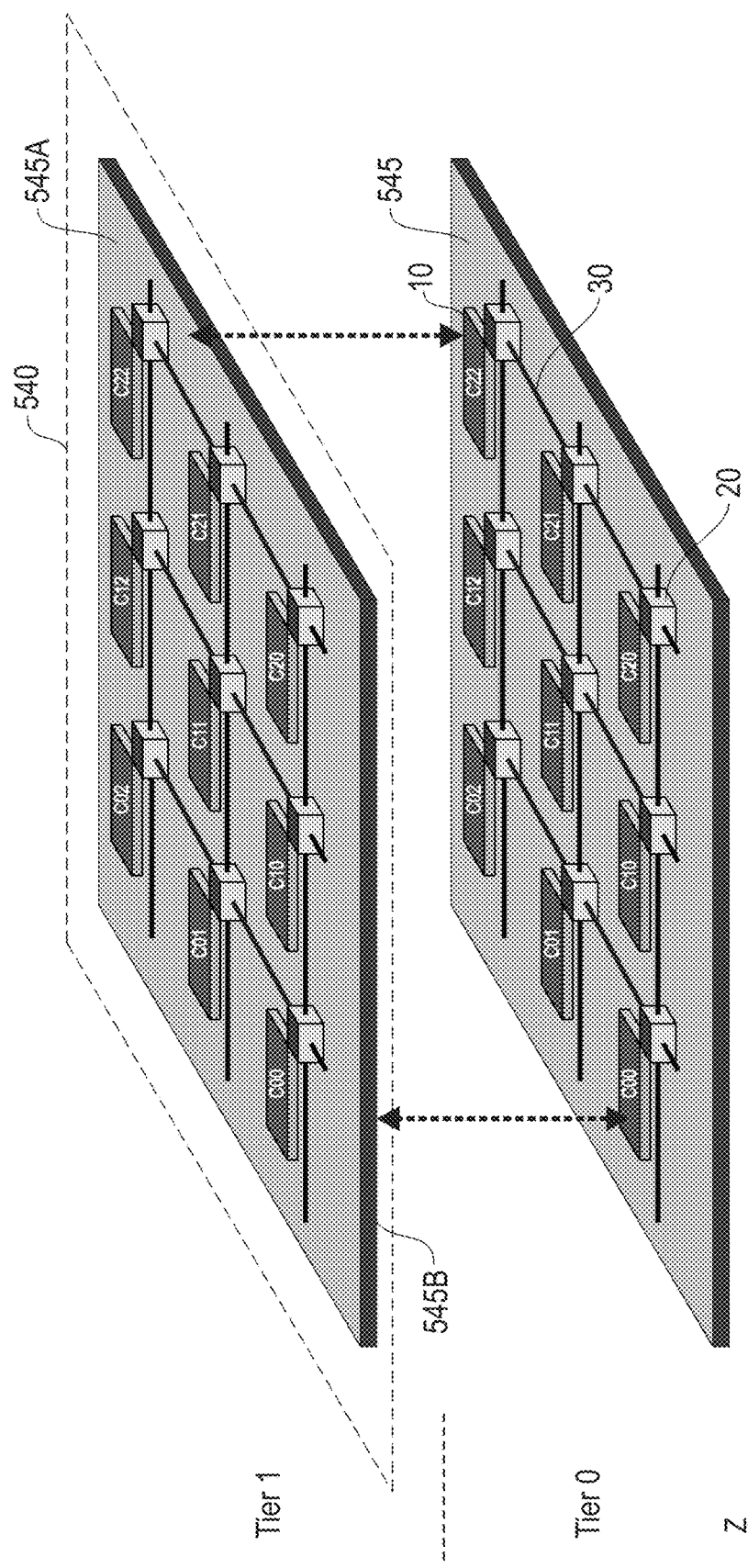
FIG. 4 illustrates bonding tiers face-to-back, in accordance with an embodiment of the invention.

FIG. 4 illustrates bonding tiers 540 face-to-back, in accordance with an embodiment of the invention. In one embodiment, an array of processor core circuits (e.g., a 1-D array 130, a 2-D array 140, or a 3-D array 100) is instantiated as an array of cores on a die, wherein each die 545 represents a tier 540. For example, as shown in FIG. 4, each Tier 0, 1 of the 3-D array 100 is represented by a die 545.

In another embodiment, an array of processor core circuits (e.g., a 1-D array 130, a 2-D array 140, or a 3-D array 100) is instantiated as an array of dies on a semiconductor wafer (or substrate) 545, wherein each wafer (or fraction of wafer, or fraction of substrate) 545 represents a tier 540. For example, each Tier 0, 1 of the 3-D array 100 may be represented by a wafer (or substrate) 545.

Each die 545 has a top side 545A and a back side 545B. Each core circuit 10 integrated on each die 545 has a corresponding physical label (i.e., index) identifying its physical location on the die 545. For example, as shown in FIG. 4, the core circuits 10 of each Tier 0, 1 have physical labels that identify said core circuits 10 as core circuits C00, C01, C02, C10, C11, C12, C20, C21, and C22.

The dies 545 representing the tiers 540 of an array of processor core circuits may be bonded face-to-back, faceto-face or back-to-back. A first die 545 is bonded face-to-back with a second die 545 when the top side 545A of the first die 545 is bonded with the back side 545B of the second die 545, as shown in FIG. 4. When the tiers 540 are bonded face-to-back, the physical orientation of each tier 540 is the same. As shown in FIG. 4, each core circuit 10 of Tier 1 is vertically aligned with a core circuit 10 of Tier 2 having the same physical label as said core circuit 10. For example, core circuit C00 of Tier 1 is aligned with core circuit C00 of Tier 0.

As the physical orientation of each tier 540 of an array of processor core circuits is the same when the tiers 540 are bonded face-to-back, the same type of die 545 may be used to represent each tier 540.

Figure 5:
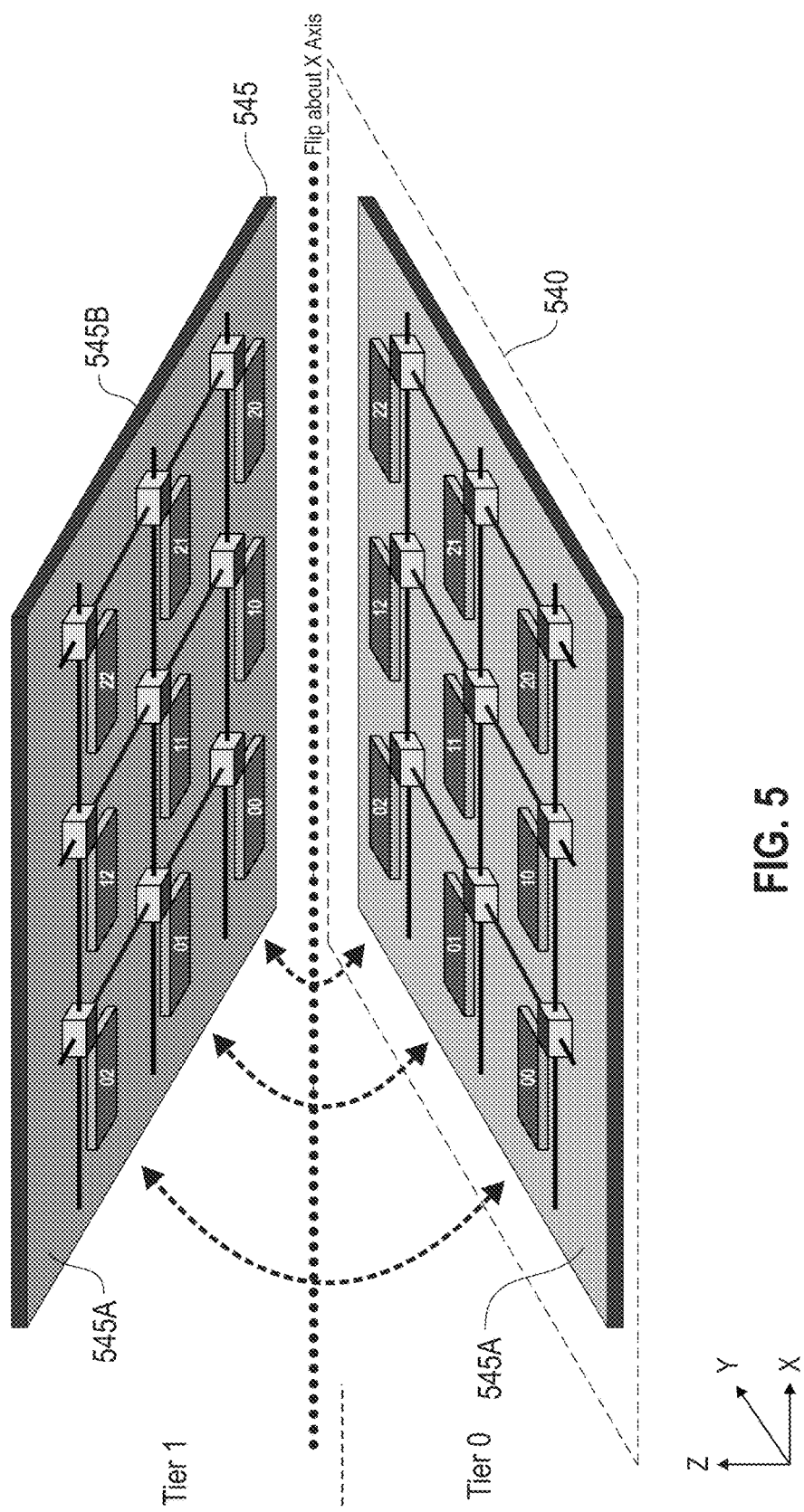
FIG. 5 illustrates bonding tiers face-to-face, in accordance with an embodiment of the invention.

FIG. 5 illustrates bonding tiers 540 face-to-face, in accordance with an embodiment of the invention. A first die 545 is bonded face-to-face with a second die 545 when the top side 545A of the first die 545 is bonded with the top side 545A of the second die 545, as shown in FIG. 5. A die 545 may be flipped about the X axis or about the Y axis to bond the top side 545A of the die 545 with the top side 545A of another die 545. As shown in FIG. 5, the die 545 representing Tier 1 is flipped about the X axis to bond Tiers 0 and 1 face-to-face.

When the tiers 540 of an array of processor core circuits are bonded face-to-face, the tiers 540 have different physical orientations. As shown in FIG. 5, at least one core circuit 10 of Tier 1 is not vertically aligned with a core circuit 10 of Tier 0 having the same physical label as said at least one core circuit 10. For example, core circuit C00 of Tier 1 is vertically aligned with core circuit C02 of Tier 0, not core circuit C00 of Tier 0.

A first die 545 is bonded back-to-back with a second die 545 when the back side 545B of the first die 545 is bonded with the back side 545B of the second die 545. A die 545 may be flipped about the X axis or about the Y axis to bond the back side 545B of the die 545 with the back side 545B of another die 545. Like face-to-face bonding, the tiers 540 of an array of processor core circuits have different physical orientations when the tiers 540 are bonded back-to-back.

As described in detail later herein, the present invention allows the same type of die 545 to be used when bonding the tiers 540 of an array of processor core circuits face-to-face or back-to-back. This removes the need to use different types of dies 545 when bonding the tiers 540 of an array of processor core circuits face-to-face or back-to-back.

The present invention allows for the same type of die 545 to be used for each tier 540 of an array of processor core circuits. In one embodiment, a software, firmware, or compiler utilizing an array of processor core circuits maps each core circuit 10 to a logical label, wherein each logical label represents a logical position of the core circuit 10 in the array. Therefore, the physical orientation of each tier 540 is transparent to the software. The dies 545 may be bonded face-to-face without using different types of dies 545.

Figure 6:
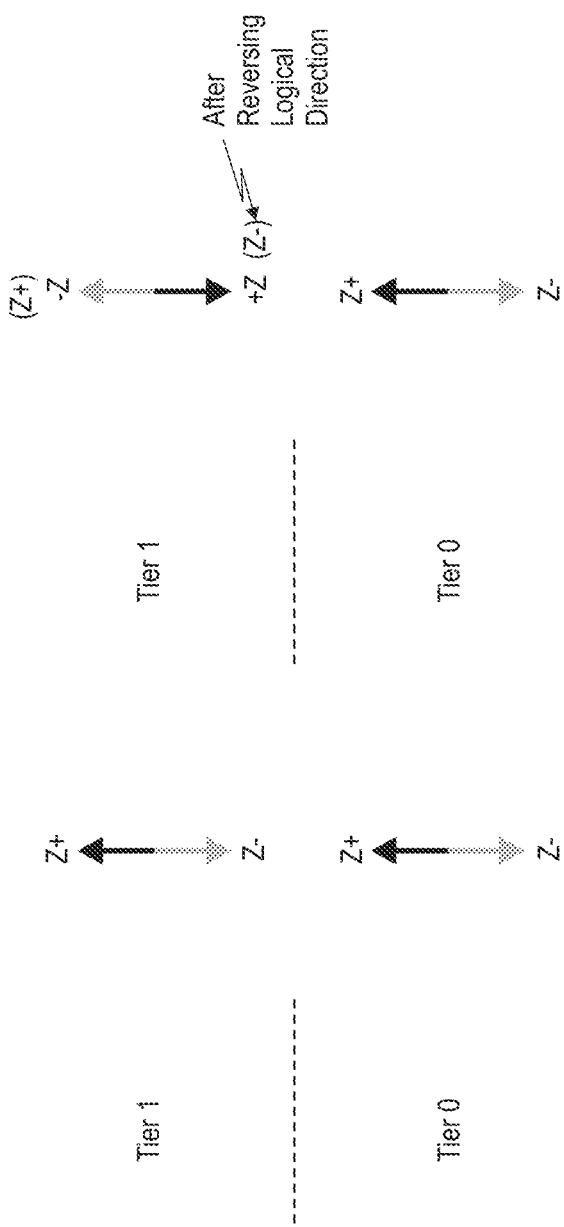
FIG. 6A illustrates the physical orientation of two tiers of a 1-D array that are bonded face-to-back, in accordance with an embodiment of the invention.
FIG. 6B illustrates the physical orientation of two tiers of a 1-D array that are bonded face-to-face by flipping a die about the Y-axis, in accordance with an embodiment of the invention.

FIG. 6A illustrates the physical orientation of two tiers 540 of a 1-D array 130 that are bonded face-to-back, in accordance with an embodiment of the invention. The physical orientation of each tier 540 of the 1-D array 130 is the same when the dies 545 representing the tiers 540 are bonded face-to-back. The interconnections between the tiers 540 are aligned. For example, each set of Z− router channels 25Z2 in Tier 1 is aligned with a set of Z+ router channels 25Z1 in Tier 0. Therefore, no mirror reversing is needed when the tiers 540 of the 1-D array 130 are bonded face-to-back.

FIG. 6B illustrates the physical orientation of two tiers 540 of a 1-D array 130 that are bonded face-to-face by flipping a die 545 about the X-axis or Y-axis, in accordance with an embodiment of the invention. The physical orientation of Tier 0 is different from the physical orientation of Tier 1 when the dies 545 corresponding to Tiers 0 and 1 are bonded face-to-face. FIG. 6B illustrates the physical orientation of Tiers 0 and 1 when the die 545 representing Tier 1 is flipped about the Y-axis. The interconnections between the tiers 540 are reversed. For example, since the physical location of each set of Z+ router channels 25Z1 and Z− router channels 25Z2 in Tier 1 is reversed, each set of Z+ router channels 25Z1 in Tier 0 is aligned with a set of Z+ router channels 25Z1 in Tier 1. This is different from FIG. 6A wherein each set of Z+ router channels 25Z1 in Tier 0 is aligned with a set of Z− router channels 25Z2 in Tier 1.

As described in detail later herein, to align each set of Z+ router channels 25Z1 in Tier 0 with a set of Z− router channels 25Z2 in Tier 1, the logical direction of each set of Z+ router channels 25Z1 and Z− router channels 25Z2 in Tier 1 is reversed. Therefore, reversing the logical direction of the Z+ router channels 25Z1 and the Z− router channels 25Z2 in Tier 1 adjusts the logical orientation of Tier 1 such that the logical orientation of Tier 1 matches the physical and logical orientation of Tier 0.

Figure 7:
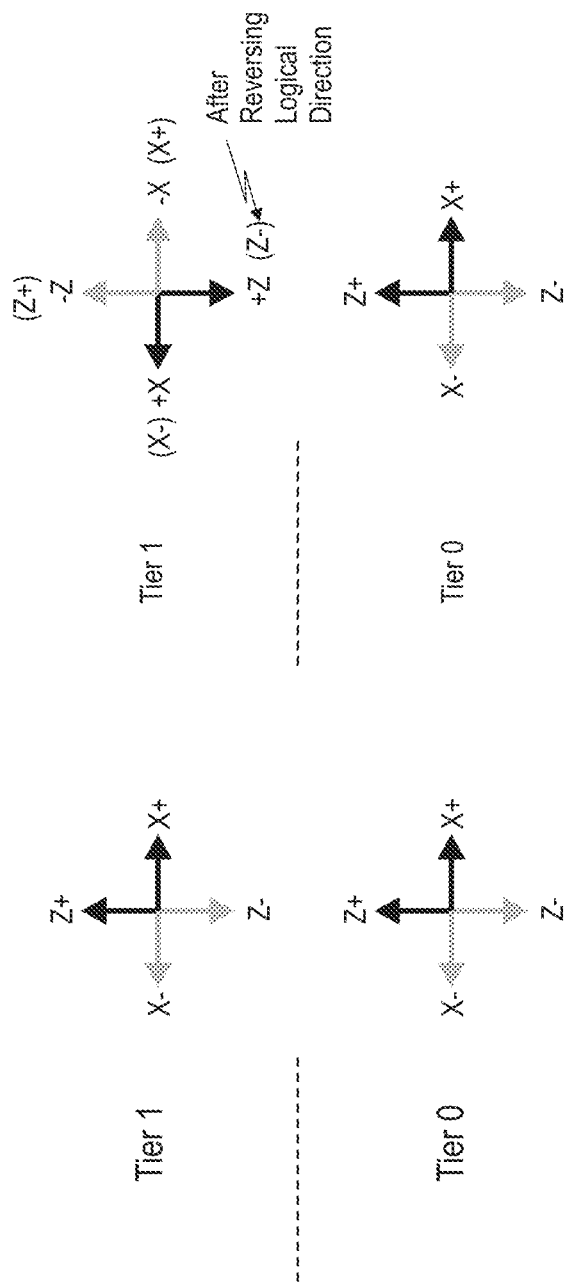
FIG. 7A illustrates the physical orientation of two tiers of a 2-D array that are bonded face-to-back, in accordance with an embodiment of the invention.
FIG. 7B illustrates the physical orientation of two tiers of a 2-D array that are bonded face-to-face by flipping a die about the Y-axis, in accordance with an embodiment of the invention.

FIG. 7A illustrates the physical orientation of two tiers 540 of a 2-D array 140 that are bonded face-to-back, in accordance with an embodiment of the invention. The physical orientation of each tier 540 of the 2-D array 140 is the same when the dies 545 representing the tiers 540 are bonded face-to-back. The interconnections between the tiers 540 are aligned. For example, each set of Z− router channels 25Z2 in Tier 1 is aligned with a set of Z+ router channels 25Z1 in Tier 0. Therefore, no mirror reversing is needed when the tiers 540 of the 2-D array 140 are bonded face-to-back.

FIG. 7B illustrates the physical orientation of two tiers 540 of a 2-D array 140 that are bonded face-to-face by flipping a die 545 about the Y-axis, in accordance with an embodiment of the invention. As stated above, the physical orientation of Tier 0 is different from the physical orientation of Tier 1 when the dies 545 corresponding to Tiers 0 and 1 are bonded face-to-face. FIG. 7B illustrates the physical orientation of Tiers 0 and 1 when the die 545 representing Tier 1 is flipped about the Y-axis. The interconnections between the tiers 540 are reversed. For example, since the physical location of each set of Z+ router channels 25Z1 and Z− router channels 25Z2 in Tier 1 is reversed, each set of Z+ router channels 25Z1 in Tier 0 is aligned with a set of Z+ router channels 25Z1 in Tier 1. This is different from FIG. 7A wherein each set of Z+ router channels 25Z1 in Tier 0 is aligned with a set of Z− router channels 25Z2 in Tier 1.

As described in detail later herein, to align each set of Z+ router channels 25Z1 in Tier 0 with a set of Z− router channels 25Z2 in Tier 1, the logical direction of each set of Z+ router channels 25Z1 and Z− router channels 25Z2 in Tier 1 is reversed.

Also shown in FIG. 7B, the physical location of each set of X+ router channels 25X1 and X− router channels 25X2 in Tier 1 is reversed. As a result, X routing between the core circuits 10 in Tier 1 is reversed (i.e., opposite of X routing between the core circuits 10 in Tier 0). As described in detail later herein, the logical direction of each set of X+ router channels 25X1 and X− router channels 25X2 in Tier 1 is reversed so that X routing between the core circuits 10 in Tier 1 matches X routing between the core circuits 10 in Tier 0.

Therefore, reversing the logical direction of the Z+ router channels 25Z1, the Z− router channels 25Z2, the X+ router channels 25X1, and the X− router channels 25X2 in Tier 1 adjusts the logical orientation of Tier 1 such that the logical orientation of Tier 1 matches the physical and logical orientation of Tier 0.

Figure 8:
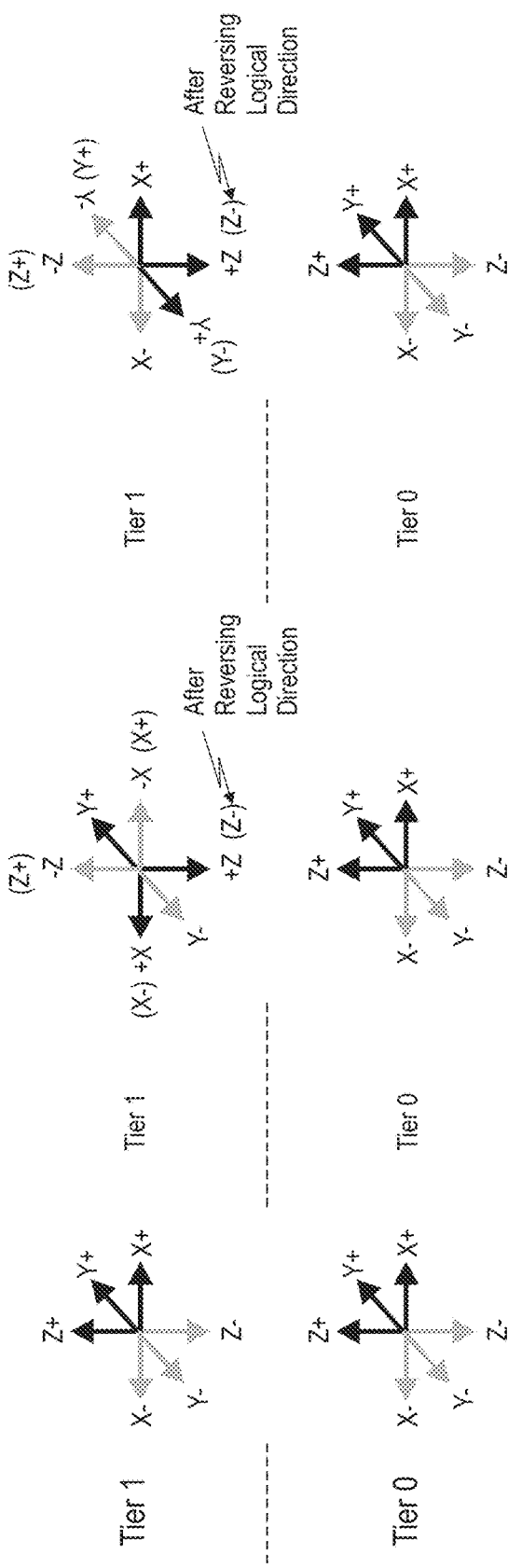
FIG. 8A illustrates the physical orientation of two tiers that are bonded face-to-back, in accordance with an embodiment of the invention.
FIG. 8B illustrates the physical orientation of two tiers that are bonded face-to-face by flipping a die about the Y-axis, in accordance with an embodiment of the invention.
FIG. 8C illustrates the physical orientation of two tiers that are bonded face-to-face by flipping a die about the X-axis, in accordance with an embodiment of the invention.

FIG. 8A illustrates the physical orientation of two tiers 540 of a 3-D array 100 that are bonded face-to-back, in accordance with an embodiment of the invention. The physical orientation of each tier 540 of the 3-D array 100 is the same when the dies 545 representing the tiers 540 are bonded face-to-back. The interconnections between the tiers 540 are aligned. For example, each set of Z− router channels 25Z2 in Tier 1 is aligned with a set of Z+ router channels 25Z1 in Tier 0. Therefore, no mirror reversing is needed when the tiers 540 of the 3-D array 100 are bonded face-to-back.

FIG. 8B illustrates the physical orientation of two tiers 540 of a 3-D array 100 that are bonded face-to-face by flipping a die 545 about the Y-axis, in accordance with an embodiment of the invention. As stated above, the physical orientation of Tier 0 is different from the physical orientation of Tier 1 when the dies 545 corresponding to Tiers 0 and 1 are bonded face-to-face. FIG. 8B illustrates the physical orientation of Tiers 0 and 1 when the die 545 representing Tier 1 is flipped about the Y-axis. The interconnections between the tiers 540 are reversed. For example, since the physical location of each set of Z+ router channels 25Z1 and Z− router channels 25Z2 in Tier 1 is reversed, each set of Z+ router channels 25Z1 in Tier 0 is aligned with a set of Z+ router channels 25Z1 in Tier 1. This is different from FIG. 8A wherein each set of Z+ router channels 25Z1 in Tier 0 is aligned with a set of Z− router channels 25Z2 in Tier 1.

As described in detail later herein, to align each set of Z+ router channels 25Z1 in Tier 0 with a set of Z− router channels 25Z2 in Tier 1, the logical direction of each set of Z+ router channels 25Z1 and Z− router channels 25Z2 in Tier 1 is reversed.

Also shown in FIG. 8B, the physical location of each set of X+ router channels 25X1 and X− router channels 25X2 in Tier 1 is reversed. As a result, X routing between the core circuits 10 in Tier 1 is reversed (i.e., opposite of X routing between the core circuits 10 in Tier 0). As described in detail later herein, the logical direction of each set of X+ router channels 25X1 and X− router channels 25X2 in Tier 1 is reversed so that X routing between the core circuits 10 in Tier 1 matches X routing between the core circuits 10 in Tier 0.

Therefore, reversing the logical direction of the Z+ router channels 25Z1, the Z− router channels 25Z2, the X+ router channels 25X1, and the X− router channels 25X2 in Tier 1 adjusts the logical orientation of Tier 1 such that the logical orientation of Tier 1 matches the physical and logical orientation of Tier 0.

FIG. 8C illustrates the physical orientation of two tiers 540 of a 3-D array 100 that are bonded face-to-face by flipping a die 545 about the X-axis, in accordance with an embodiment of the invention. The physical orientation of Tier 0 is different from the physical orientation of Tier 1 when the dies 545 corresponding to Tiers 0 and 1 are bonded face-to-face. FIG. 8C illustrates the physical orientation of Tiers 0 and 1 when the die 545 representing Tier 1 is flipped about the X-axis. The interconnections between the tiers 540 are reversed. For example, since the physical location of each set of Z+ router channels 25Z1 and Z− router channels 25Z2 in Tier 1 is reversed, each set of Z+ router channels 25Z1 in Tier 0 is aligned with a set of Z+ router channels 25Z1 in Tier 1. This is different from FIG. 8A wherein each set of Z+ router channels 25Z1 in Tier 0 is aligned with a set of Z− router channels 25Z2 in Tier 1.

As described in detail later herein, to align each set of Z+ router channels 25Z1 in Tier 0 with a set of Z− router channels 25Z2 in Tier 1, the logical direction of each set of Z+ router channels 25Z1 and Z− router channels 25Z2 in Tier 1 is reversed.

Also shown in FIG. 8C, the physical location of each set of Y+ router channels 25Y1 and Y− router channels 25Y2 in Tier 1 is reversed. As a result, Y routing between the core circuits 10 in Tier 1 is reversed (i.e., opposite of Y routing between the core circuits 10 in Tier 0). As described in detail later herein, the logical direction of each set of Y+ router channels 25Y1 and Y− router channels 25Y2 in Tier 1 is reversed so that Y routing between the core circuits 10 in Tier 1 matches Y routing between the core circuits 10 in Tier 0.

Therefore, reversing the logical direction of the Z+ router channels 25Z1, the Z− router channels 25Z2, the Y+ router channels 25Y1, and the Y− router channels 25Y2 in Tier 1 adjusts the logical orientation of Tier 1 such that the logical orientation of Tier 1 matches the physical and logical orientation of Tier 0.

Figure 9:
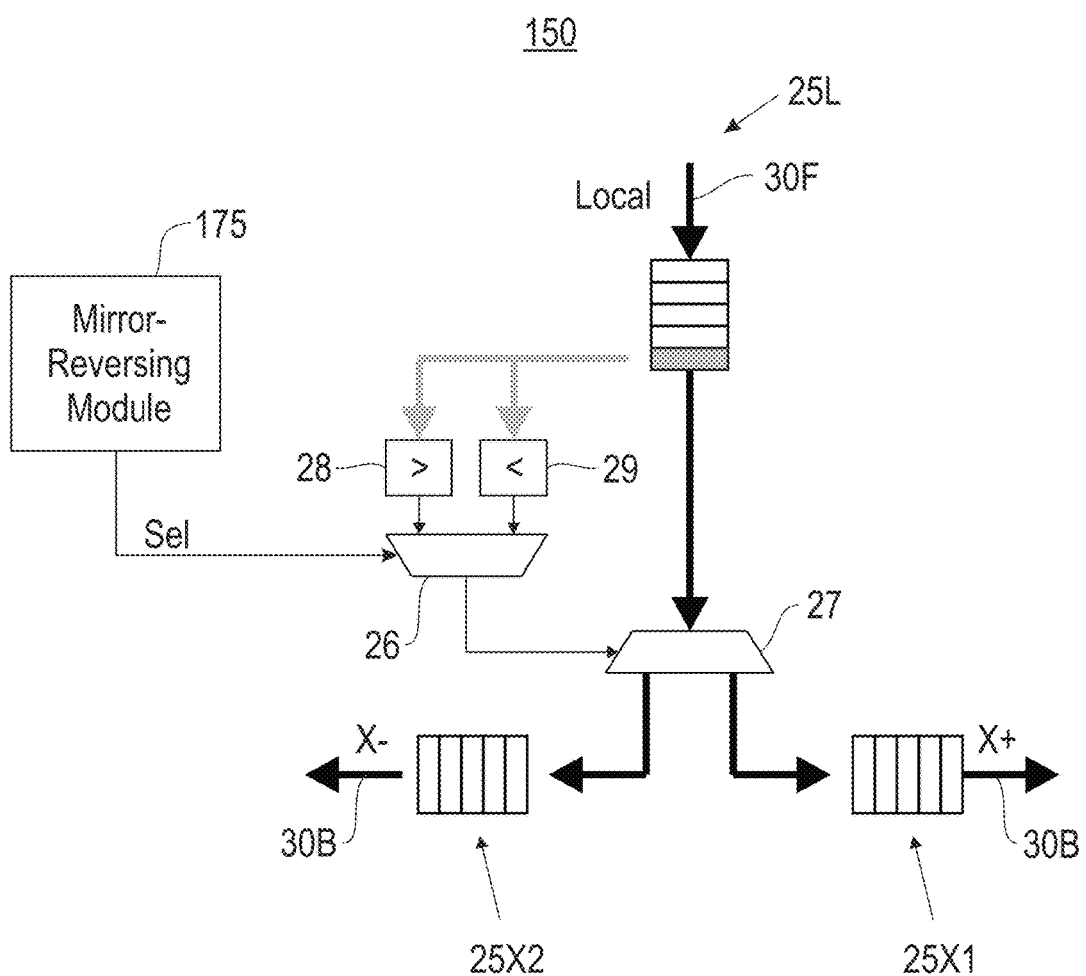
FIG. 9 illustrates an example mirror-reversing routing circuit for reversing the logical direction of router channels, in accordance with an embodiment of the invention.

FIG. 9 illustrates an example mirror-reversing routing circuit 150 for reversing the logical direction of router channels, in accordance with an embodiment of the invention. In one embodiment, the physical orientation of each tier 540 of an array of processor core circuits is transparent to any computer program product (i.e., software, compiler) utilizing the array. The physical location of each core circuit 10 in an array of processor core circuits is mapped to a logical label identifying a logical location, thereby allowing the computer program product to utilize logical locations, instead of physical locations, during computation. For example, when Tiers 0 and 1 are bonded face-to-face as shown in FIG. 5, the core circuits 10 in Tier 1 with physical labels C00, C01, C02, C10, C11, C12, C20, C21, and C22 are logically mapped as core circuits 10 with logical labels C02, C01, C00, C12, C11, C10, C22, C21, and C20, respectively.

In one embodiment, each switch 20 includes at least one routing circuit 150 for reversing the logical direction of some router channels. Each circuit 150 maintains dimension ordered routing (i.e., there is no swapping between X, Y and Z routing).

In one embodiment, each circuit 150 is configured for absolute addressing. Each circuit 150 of each switch 20 includes a programmable position register for maintaining a corresponding self address (e.g. the address of the switch 20). For example, during normal operation (i.e., not in mirror-reversing mode), each circuit 150 determines whether a destination address (i.e., route word) for a packet is greater than the corresponding self address of the circuit 150. If the destination address is greater than the corresponding self address, the circuit 150 sends the packet in the X+ direction 25X1. Otherwise, it sends the packet in the X− direction 25X2. If the circuit 150 is set to mirror-reverse mode using a mirror-reversing select bit Sel, the circuit 150 logically reverses the direction that the packet is sent. In this case, the circuit 150 sends the packet in the X+ direction 25X1 if the destination address is less than the corresponding self address. Otherwise, it sends the packet in the X− direction 25X2.

For example, in one embodiment, a circuit 150 for a set of Local router channels 25L of a switch 20 comprises a first comparison unit 28, a second comparison unit 29, a reverse selector unit 26, and a routing unit 27. For each packet received from a corresponding core circuit 10 via an incoming router channel 30F of the set of Local router channels 25L, the destination address of the packet is provided to the comparison units 28 and 29. The first comparison unit 28 determines whether the destination address is greater than the corresponding self address of the circuit 150. The second comparison unit 29 determines whether the destination address is less than the corresponding self address of the circuit 150. The multiplexor 26 selects between the greater than and less than operations, based on the mirror-reversing select bit Sel.

The reverser selector unit 26 receives the select bit Sel from an external mirror-reversing module 175. The mirror-reversing module 175 configures the select bit Sel based on whether the tiers 540 of the array of processor core circuits are bonded face-to-back, face-to-face, or back-to-back. For example, the mirror-reversing module 175 sets the select bit Sel (e.g., to "1") when the tiers 540 of the array of processor core circuits are bonded face-to-face or back-to-back. The reverse selector unit 26 is configured to enable mirror reversing based on the select bit Sel and the comparison units 28 and 29. Specifically, if the destination address is greater than or less than the corresponding self address of the circuit 150 and the select bit Sel is set (e.g., to "1"), the reverse selector unit 26 enables mirror-reversing. If mirror reversing is enabled, the routing unit 27 routes the packet in a direction opposite of normal operation (i.e., not mirror-reversing mode). For example, if the destination address is in the X+ direction, the circuit 150 routes the packet in the X− direction instead. If the destination address is the same as the corresponding self address of the circuit 150 or the select bit Sel is not set (e.g., is "0"), the reverse selector unit 26 disables mirror-reversing. If mirror reversing is disabled, the routing unit 27 routes the packet in the direction corresponding to the destination address. For example, if the destination address is in the X+ direction, the circuit 150 routes the packet in the X+ direction.

In one embodiment, when the select bit Sel is set, each switch 20 is configured to: (1) route packets from the Local router channels 25L with destination addresses in the X+ or the X− direction to the X− or the X+ direction, respectively; (2) route packets from the X+ or X− router channels 25X1, 25X2 with destination addresses in the Y+ or the Y− direction to the Y− or the Y+ direction, respectively; and (3) route packets from the Y+ or Y− router channels 25Y1, 25Y2 with destination addresses in the Z+ or the Z− direction to the Z− or the Z+ direction, respectively.

In another embodiment, the circuit 150 is configured for relative addressing. The circuit 150 determines whether the destination address for a packet is a positive (+) address (i.e., an address in the Z+, X+ or Y+ direction) or a negative (−) address (i.e., an address in the Z−, X− or Y− direction). If the destination address for a packet is a positive address and the select bit Sel is set, the circuit 150 reverses the destination address to a negative address. If the destination address for a packet is a negative address and the select bit Sel is set, the circuit 150 reverses the destination address to a positive address.

Each tier 540 includes top, bottom, and through-substrate interconnect circuits 200 (FIG. 10) for bonding with a different tier 540.

Figure 10:
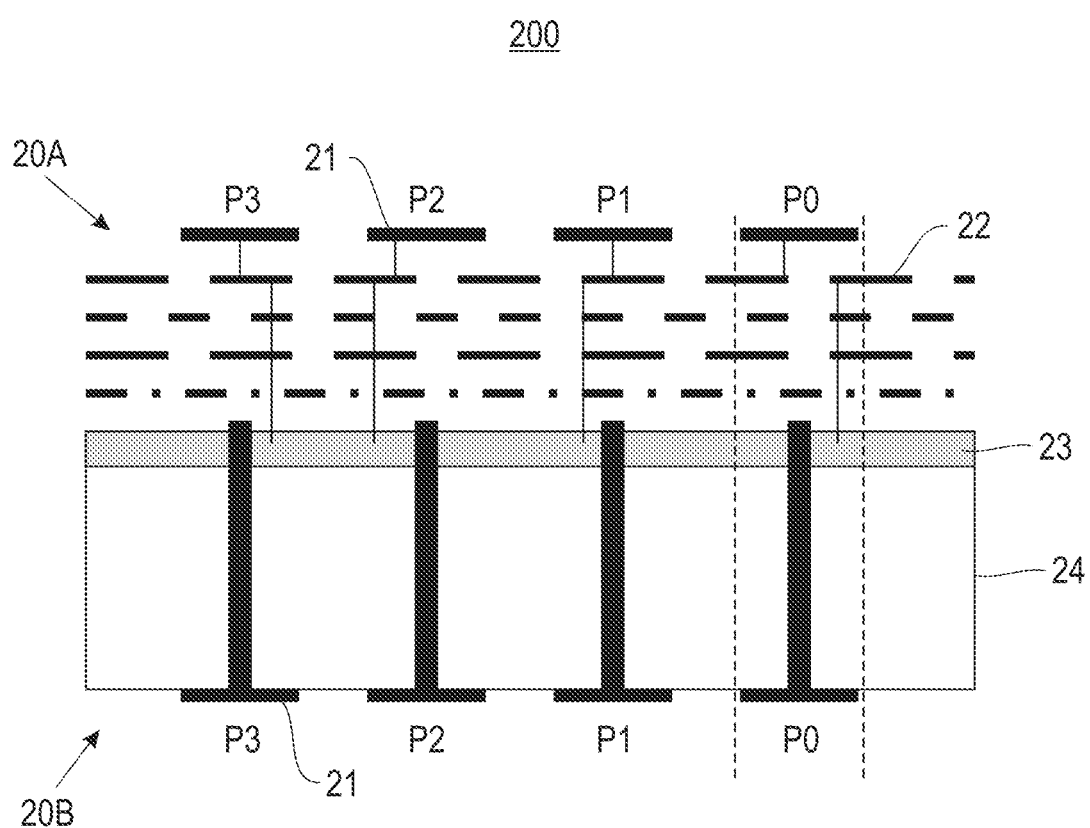
FIG. 10 illustrates a cross-sectional view of an example mirror-reversing interconnect circuit of a tier for bonding with a different tier, in accordance with an embodiment of the invention.

FIG. 10 illustrates a cross-sectional view of an example mirror-reversing interconnect circuit 200 of a tier 540 for bonding with a different tier 540, in accordance with an embodiment of the invention. In one embodiment, each die 545 representing a tier 540 has a metallic top contact 20A and a metallic back contact 20B. Each contact 20A, 20B of each die 545 includes at least one interconnect pad 21 for each core circuit 10 integrated on said die 545. Each pad 21 of each contact 20A, 20B is used for bonding said contact 20A, 20B with a contact 20A or 20B of another die 545.

In one embodiment, each pad 21 disposed on the top contact 20A is vertically aligned with a pad 21 disposed on the back contact 20B. For example, a first pad P0 of the top contact 20A is vertically aligned with a first pad P0 of the back contact 20B.

In one embodiment, each die 545 further comprises a metal stack 22, an active device 23, and a substrate 24. In one embodiment, the active devices 23 are transistors. The metal stack 22 and the active devices 23 comprise all of the computation, communication, and memory circuits on the die 545, such as switches, routers, processing cores, memory, etc.

In one embodiment, the pads 21 are physically positioned such that the pads 21 are symmetric across mirroring dimensions.

Figure 11:
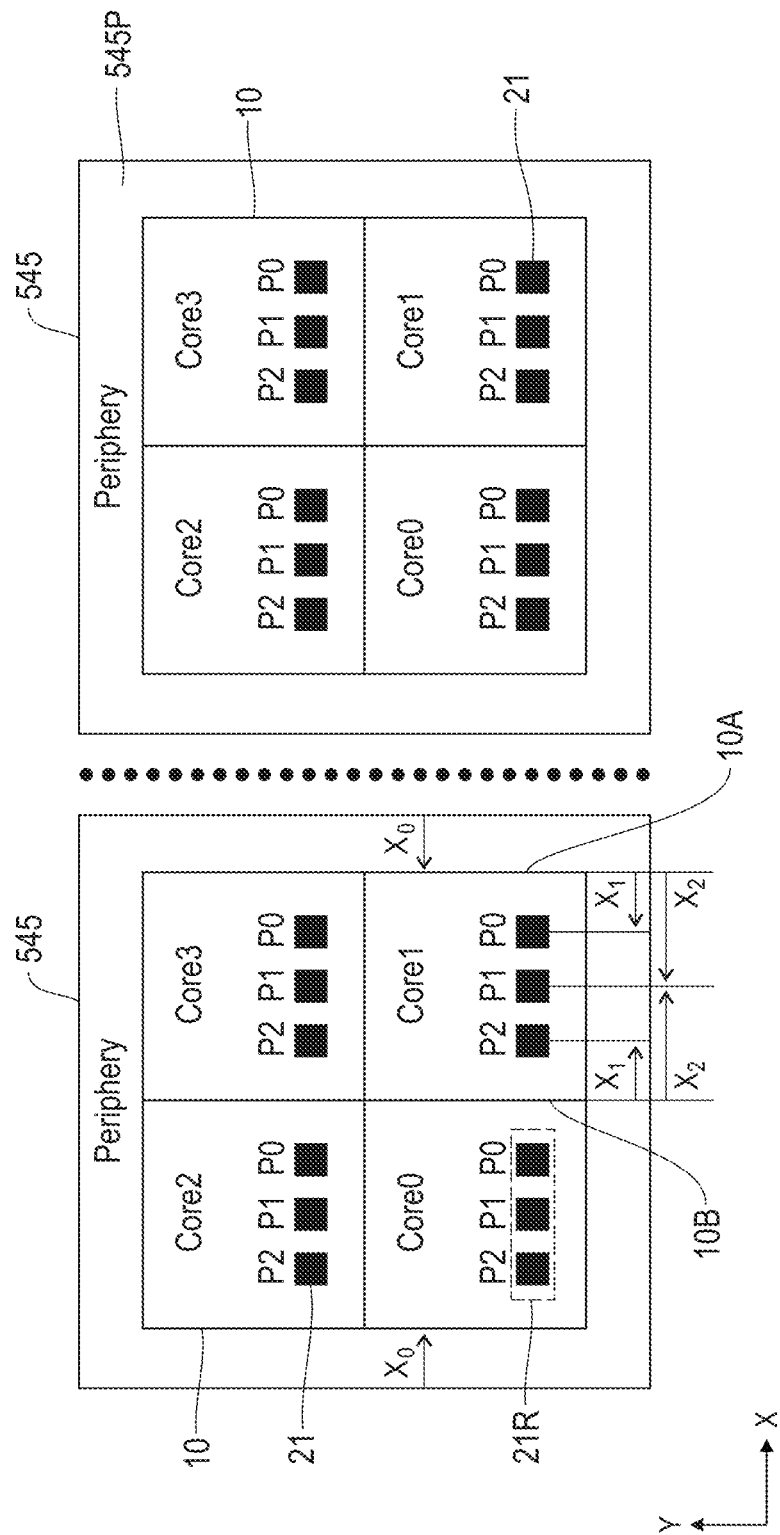
FIG. 11 illustrates core circuits having an odd number of pads, wherein the pads have horizontally symmetrical physical locations, in accordance with an embodiment of the invention.

FIG. 11 illustrates core circuits 10 having an odd number of pads 21, wherein the pads 21 have horizontally symmetrical physical locations, in accordance with an embodiment of the invention. In one embodiment, each core circuit 10 has at least one row 21R of pads 21. Each row 21R comprises N pads 21, wherein N is an odd or even numbered integer. For example, as shown in FIG. 11, each core circuit 10 has 3 contact pads 21, such as a first pad P0, a second pad P1, and a third pad P2.

In one embodiment, each core circuit 10 has a first side 10A and a second side 10B that is opposite of the first side 10A. Let i denote the index of a pad 21 within each row 21R. As shown in FIG. 11, the pads 21 on each core circuit 10 have horizontally symmetrical physical locations. Specifically, each $i^{th}$ pad within a row 21R of a core circuit 10 is arranged such that the distance from the first side 10A of the core circuit 10 to said $i^{th}$ pad is equal to the distance from the second end 10B of the core circuit 10 to the $(N-i-1)^{th}$ pad of the row 21R, wherein in i=0, . . . , N−1. For example, as shown in FIG. 11, the distance $x_1$ between pad P0 of core circuit Core1 and the first side 10A of core circuit Core1 is equal to the distance $x_1$ between pad P2 of core circuit Core1 and the second side 10B of core circuit Core1. Also shown in FIG. 11, the distance $x_2$ between pad P1 of core circuit Core1 and the first side 10A of core circuit Core1 is equal to the distance $x_2$ between pad P1 of core circuit Core1 and the second side 10B of core circuit Core1.

In one embodiment, each die 545 has a peripheral area 545P with a width $x_0$. The distance $x_0$ from an edge of the die 545 to an edge of the core circuit Core0 is equal to the distance $x_0$ from an opposite edge of the die 545 to an edge of the core circuit Core1.

Since the pads 21 on each core circuit 10 have horizontally symmetrical physical locations, the pads 21 on a first die 545 vertically align with the pads 21 on a second die 545 when the first and second dies 545 are bonded face-to-back, face-to-face, or back-to-back.

Figure 12:
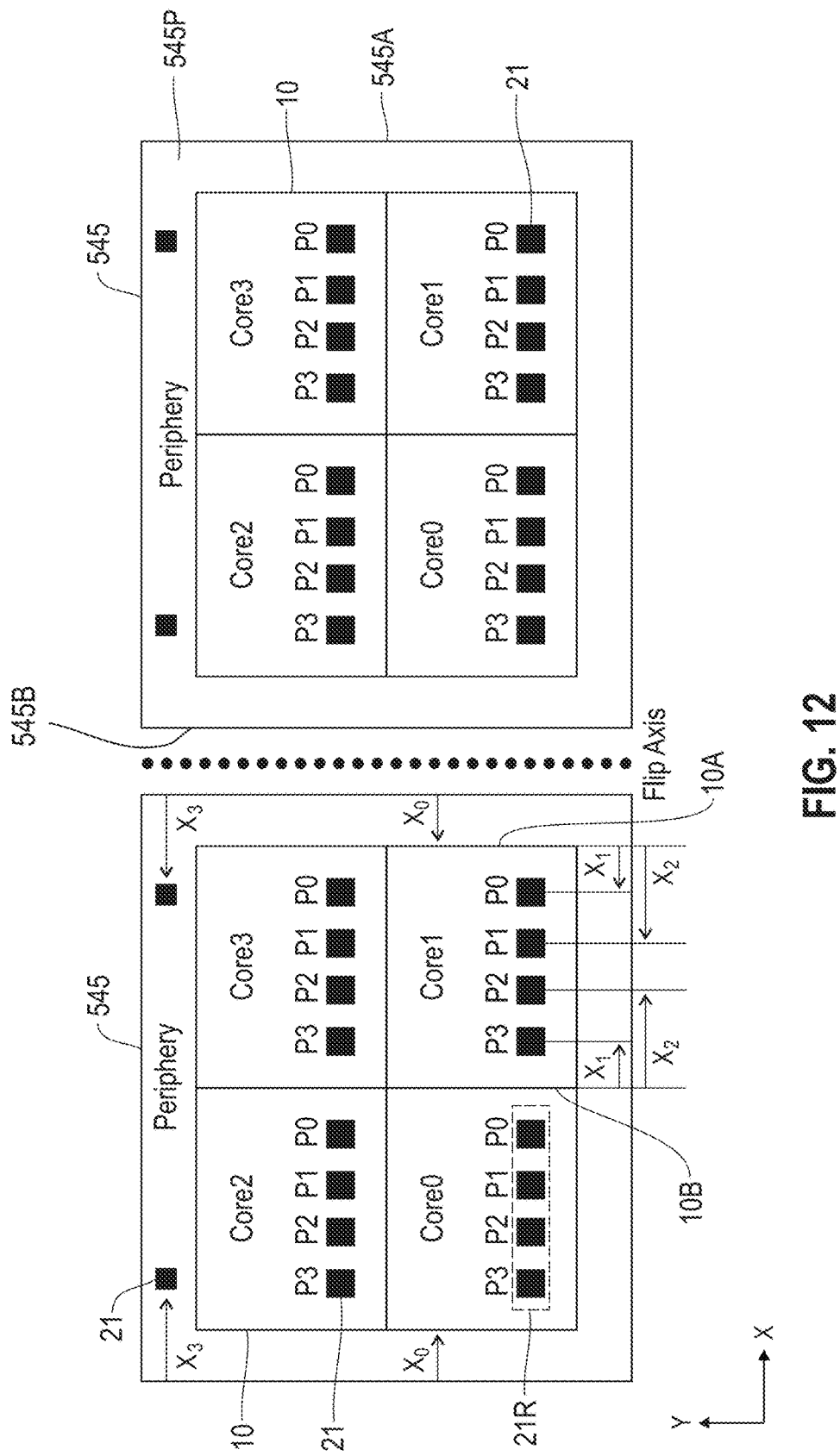
FIG. 12 illustrates core circuits having an even number of pads, wherein the pads have horizontally symmetrical physical locations, in accordance with an embodiment of the invention.

FIG. 12 illustrates core circuits 10 having an even-number of pads 21, wherein the pads 21 have horizontally symmetric physical locations, in accordance with an embodiment of the invention. As stated above, each row 21R comprises N pads 21, wherein N is an odd or even numbered integer. For example, as shown in FIG. 12, each core circuit 10 has 4 contact pads 21, such as a first pad P0, a second pad P1, a third pad P2, and a fourth pad P3.

In one embodiment, each die 545 includes at least one row of M pads 21 disposed on the peripheral area 545P of the die 545, wherein M is an integer greater than 1. In one embodiment, each die 545 has a first side 545A and a second side 545B that is opposite of the first side 545A. Let j denote the index of a pad 21 within a row disposed on the peripheral area 545P of a die 545. As shown in FIG. 12, the pads 21 on the peripheral area 545P of each die 545 have horizontally symmetrical physical locations. Specifically, each $j^{th}$ pad within each row on the peripheral area 545P of each die 545 is arranged such that the distance from the first side 545A of the die 545 to said $j^{th}$ pad is equal to the distance from the second end 545B of the die 545 to the $(M-j-1)^{th}$ pad of the row, wherein in j=0, . . . , M−1. For example, as shown in FIG. 12, each die 545 includes a first pad 21 and a second pad 21 disposed on the peripheral area 545P of the die 545, wherein the first pad 21 is positioned at a distance $x_3$ from the side 545A of the die 545, and the second pad 21 is positioned at a distance $x_3$ from the side 545B of the die 545.

Figure 13:
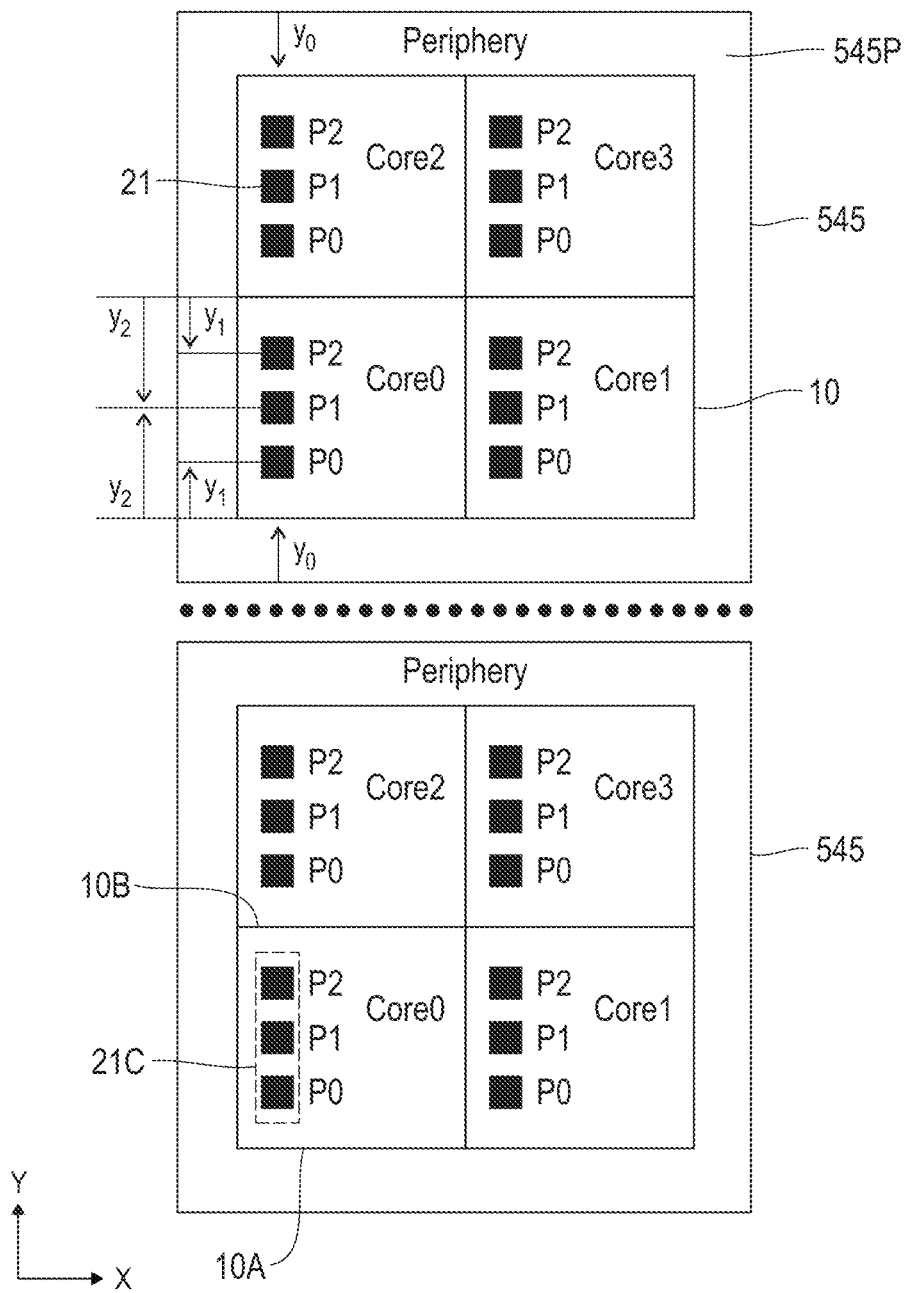
FIG. 13 illustrates core circuits having an odd number of pads, wherein the pads have vertically symmetrical physical locations, in accordance with an embodiment of the invention.

FIG. 13 illustrates core circuits 10 having an odd number of pads 21, wherein the pads 21 have vertically symmetrical physical locations, in accordance with an embodiment of the invention. In one embodiment, each core circuit 10 has at least one column 21C of pads 21. Each column 21C comprises N pads 21, wherein N is an odd or even numbered integer. For example, as shown in FIG. 13, each core circuit 10 has 3 contact pads 21, such as a first pad P0, a second pad P1, and a third pad P2.

Let i denote the index of a pad 21 within each column 21C. As shown in FIG. 13, the pads 21 on each core circuit 10 have vertically symmetrical physical locations. Specifically, each $i^{th}$ pad within a column 21C of a core circuit 10 is arranged such that the distance from the first side 10A of the core circuit 10 to said $i^{th}$ pad is equal to the distance from the second end 10B of the core circuit 10 to the $(N-i-1)^{th}$ pad of the column 21C, wherein in i=0, . . . , N−1. For example, as shown in FIG. 13, the distance $y_1$ between pad P0 of core circuit Core0 and the first side 10A of core circuit Core0 is equal to the distance $y_1$ between pad P2 of core circuit Core0 and the second side 10B of core circuit Core0. Also shown in FIG. 13, the distance y2 between pad P1 of core circuit Core0 and the first side 10A of core circuit Core0 is equal to the distance $y_2$ between pad P1 of core circuit Core0 and the second side 10B of core circuit Core0.

In one embodiment, each die 545 has a peripheral area 545P with a width $y_0$. The distance $y_0$ from an edge of the die 545 to an edge of the core circuit Core0 is equal to the distance $y_0$ from an opposite edge of the die 545 to an edge of the core circuit Core2.

Since the pads 21 on each core circuit 10 have vertically symmetric physical locations, the pads 21 on a first die 545 vertically align with the pads 21 on a second die 545 when the first and second dies 545 are bonded face-to-back, face-to-face, or back-to-back.

Figure 14:
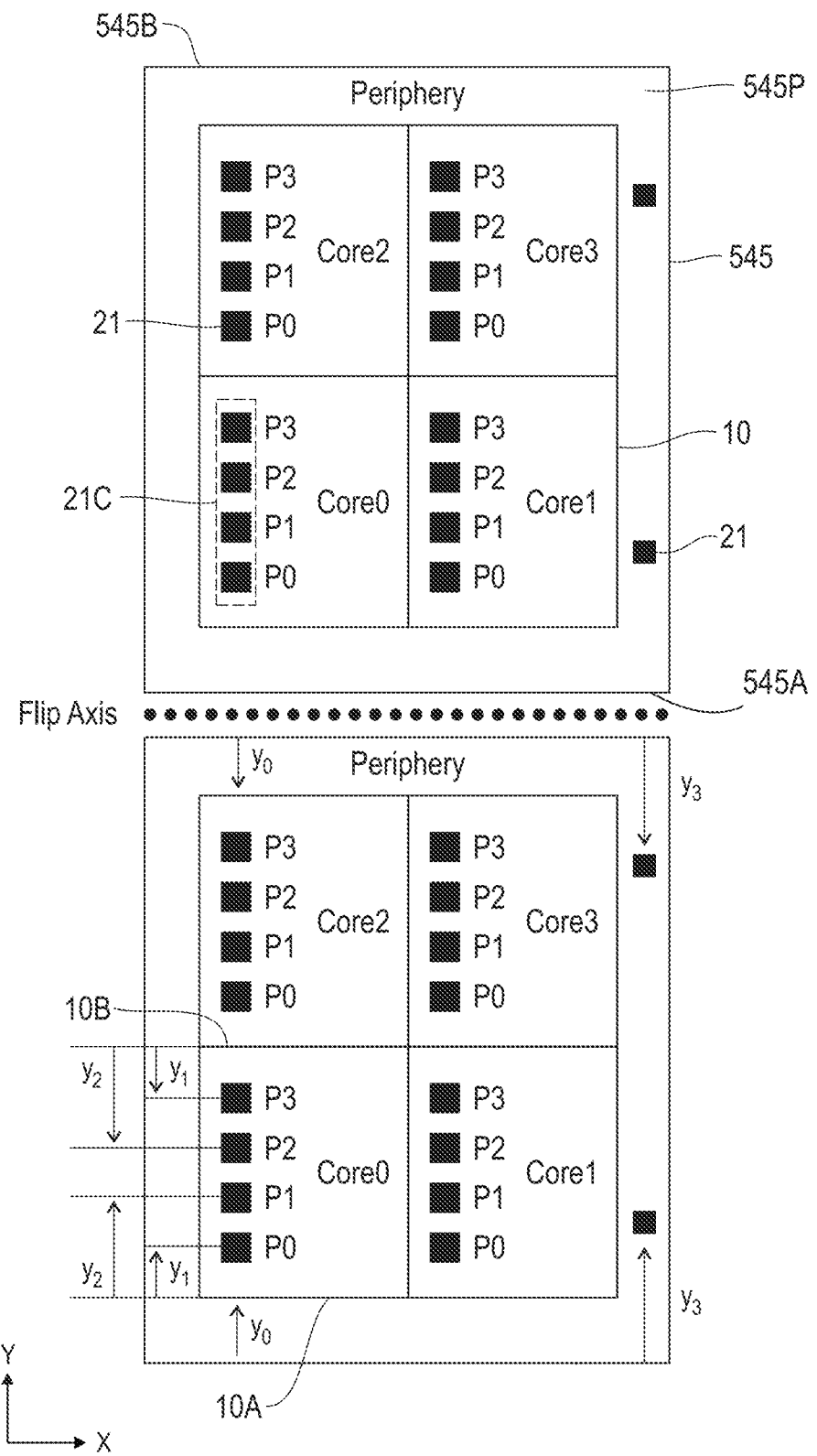
FIG. 14 illustrates core circuits having an even number of pads, wherein the pads have vertically symmetrical physical locations, in accordance with an embodiment of the invention.

FIG. 14 illustrates core circuits 10 having an even number of pads 21, wherein the pads 21 have vertically symmetrical physical locations, in accordance with an embodiment of the invention. As stated above, each column 21C comprises N pads 21, wherein N is an odd or even numbered integer. For example, as shown in FIG. 14, each core circuit 10 has 4 contact pads 21, such as a first pad P0, a second pad P1, a third pad P2, and a fourth pad P3.

In one embodiment, each die 545 includes at least one column of M pads 21 disposed on the peripheral area 545P of the die 545, wherein M is an integer greater than 1. Let j denote the index of a pad 21 within a column disposed on the peripheral area 545P of a die 545. As shown in FIG. 14, the pads 21 on the peripheral area 545P of each die 545 have vertically symmetrical physical locations. Specifically, each $j^{th}$ pad within each column on the peripheral area 545P of each die 545 is arranged such that the distance from the first side 545A of the die 545 to said $j^{th}$ pad is equal to the distance from the second end 545B of the die 545 to the $(M-j-1)^{th}$ pad of the row, wherein in j=0, . . . , M−1. For example, as shown in FIG. 14, each die 545 includes a first pad 21 and a second pad 21 disposed on the peripheral area 545P of the die 545, wherein the first pad 21 is positioned at a distance $y_3$ from the side 545A of the die 545, and the second pad 21 is positioned at a distance $y_3$ from the side 545B of the die 545.

Figure 15:
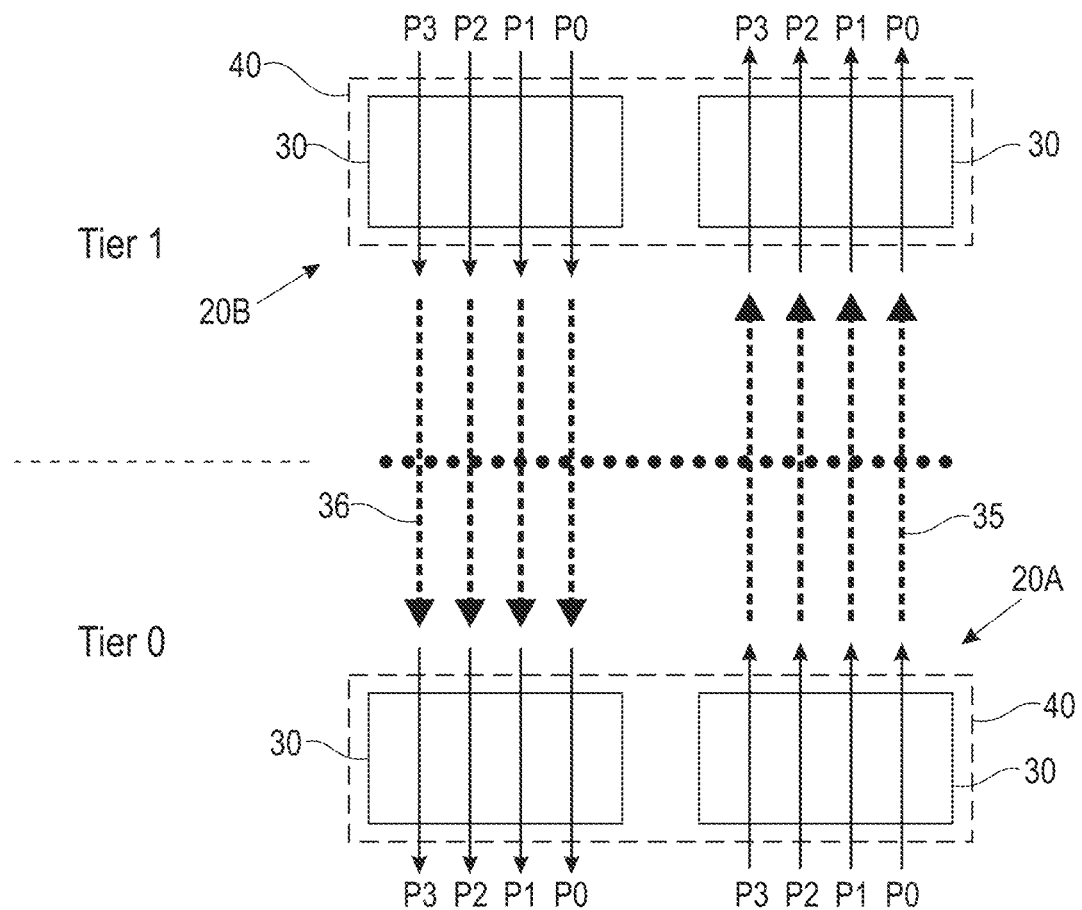
FIG. 15 illustrates straight-through buses, in accordance with an embodiment of the invention.

FIG. 15 illustrates straight-through buses 30, in accordance with an embodiment of the invention. Each pad 21 is configured to receive at least one incoming bus signal 36 and send at least one outgoing bus signal 35. In one embodiment, each row 21R or column 21C of pads 21 has at least one multiplexor structure ("multiplexor") 40 that is configured to enable mirror-reversing for the bus signals received by, or sent by, the pads 21. Specifically, each multiplexor 40 is configured for selecting between straight-through buses 30 or reversed buses 31 (FIG. 17) for the bus signals based on a select bit Sel (e.g., from a mirror-reversing module 175) that is set when the dies 545 of the array of processor core circuits are bonded face-to-face or back-to-back (i.e., set the select bit Sel to enable mirror-reversing).

For example, if Tiers 0 and 1 are bonded face-to-back as shown in FIG. 15, each multiplexor 40 of each Tier 0, 1 selects straight-through buses 30 for the bus signals. Therefore, outgoing bus signals 36 from Tier 1 and Tier 0 are routed to Tier 0 and Tier 1, respectively, without mirror-reversing the bus signals. For example, an outgoing bus signal from pad P3 of the back contact 20B of Tier 1 is routed straight through to pad P3 of the top contact 20A of Tier 0. As another example, an outgoing bus signal from pad P0 of the top contact 20A of Tier 0 is routed straight through to pad P0 of the back contact 20B of Tier 1.

Figure 16:
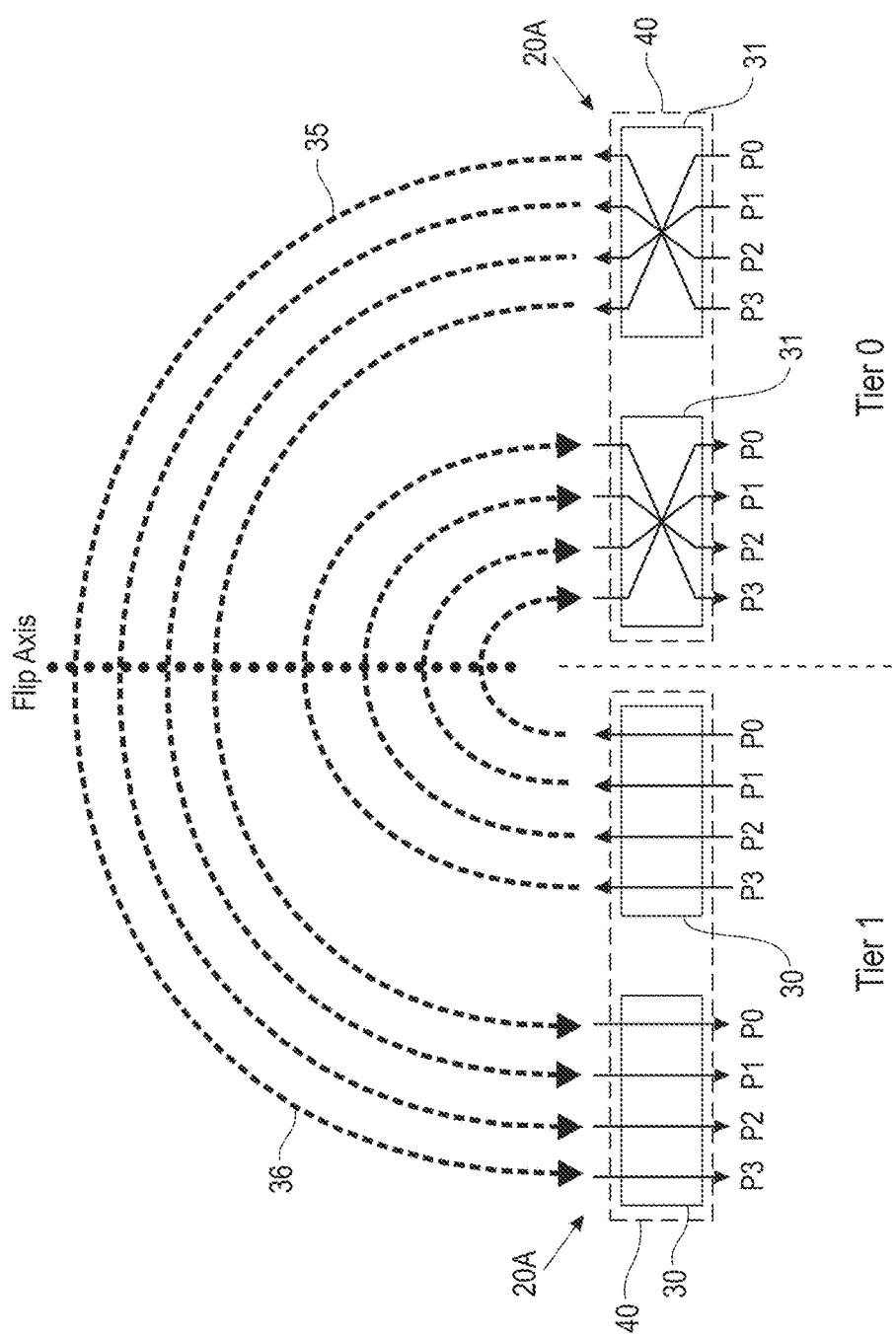
FIG. 16 illustrates straight-through buses and reversed buses, in accordance with an embodiment of the invention.

FIG. 16 illustrates straight-through buses 30 and reversed buses 31, in accordance with an embodiment of the invention. If Tiers 1 and 0 are bonded face-to-face as shown in FIG. 16, mirror-reversing is needed for some bus signals. In one embodiment, each multiplexor 40 of Tier 1 selects straight-through buses 30 and each multiplexor 40 of Tier 0 selects reversed buses 31. The reversed buses 31 selected for Tier 0 mirror-reverses the incoming bus signals 36. Specifically, each incoming bus signal 36 from a $j^{th}$ pad within a row 21R/column 21C of M pads 21 in Tier 1 is routed to the $(M-j-1)^{th}$ pad of a row 21R/column 21C of M pads 21 in Tier 0, wherein in j=0, . . . , M−1. For example, an incoming bus signal 36 from pad P3 of the top contact 20A of Tier 1 is routed to pad P0 of the top contact 20A of Tier 0.

The reversed buses 31 selected for Tier 0 also mirror-reverses the outgoing bus signals 35. Specifically, each outgoing bus signal 35 from a $j^{th}$ pad within a row 21R/column 21C of M pads 21 in Tier 0 is routed to the $(M-j-1)^{th}$ pad of a row 21R/column 21C of M pads 21 in Tier 1, wherein in j=0, . . . , M−1. For example, an outgoing bus signal from pad P0 of the top contact 20A of Tier 0 is routed to pad P3 of the top contact 20B of Tier 1.

Figure 17:
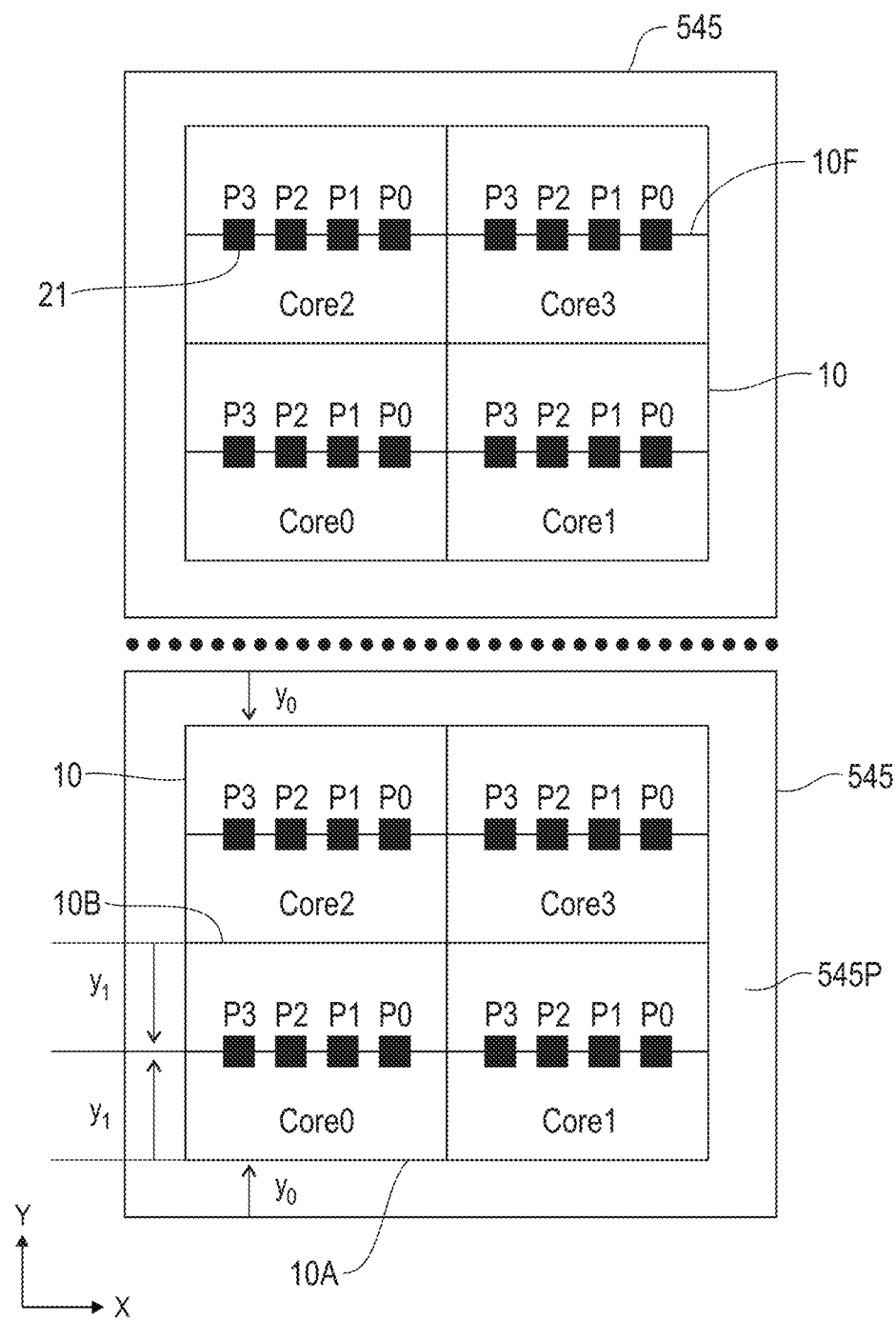
FIG. 17 illustrates core circuits having pads with vertically symmetrical physical locations, wherein each pad is disposed along a center axis of a core circuit, in accordance with an embodiment of the invention.

FIG. 17 illustrates core circuits 10 having pads 21 with vertically symmetrical physical locations, wherein each pad 21 is disposed along a center axis 10F of a core circuit 10, in accordance with an embodiment of the invention. In one embodiment, each core circuit 10 has Q pads 21, wherein Q is an integer greater than 1. Each pad 21 is physically located along a center axis 10F of the core circuit 10. For example, as shown in FIG. 17, each core circuit 10 has 4 pads 21 disposed along the center axis 10F, such as a first pad P0, a second pad P1, a third pad P2, and a fourth pad P3.

Let i denote the index of a pad 21 disposed along the center axis 10F of a core circuit 10. As shown in FIG. 13, the pads 21 on each core circuit 10 have vertically symmetrical physical locations. Specifically, each $i^{th}$ pad disposed along the center axis 10F of each core circuit 10 is arranged such that the distance from the first side 10A of the core circuit 10 to said $i^{th}$ pad is equal to the distance from the second end 10B of the core circuit 10 to said $i^{th}$ pad, wherein in i=0, . . . , Q-1. For example, as shown in FIG. 17, the distance $y_1$ between pad P3 of core circuit Core0 and the first side 10A of core circuit Core0 is equal to the distance $y_1$ between pad P3 of core circuit Core0 and the second side 10B of core circuit Core0.

Since the pads 21 on each core circuit 10 have vertically symmetrical physical locations, the pads 21 on a first die 545 vertically align with the pads 21 on a second die 545 when the first and second dies 545 are bonded face-to-back, face-to-face, or back-to-back. Furthermore, no mirror-reversing of bus signals is needed when the pads 21 are disposed along the center axis 10F of each core circuit 10, as described above.

Figure 18:
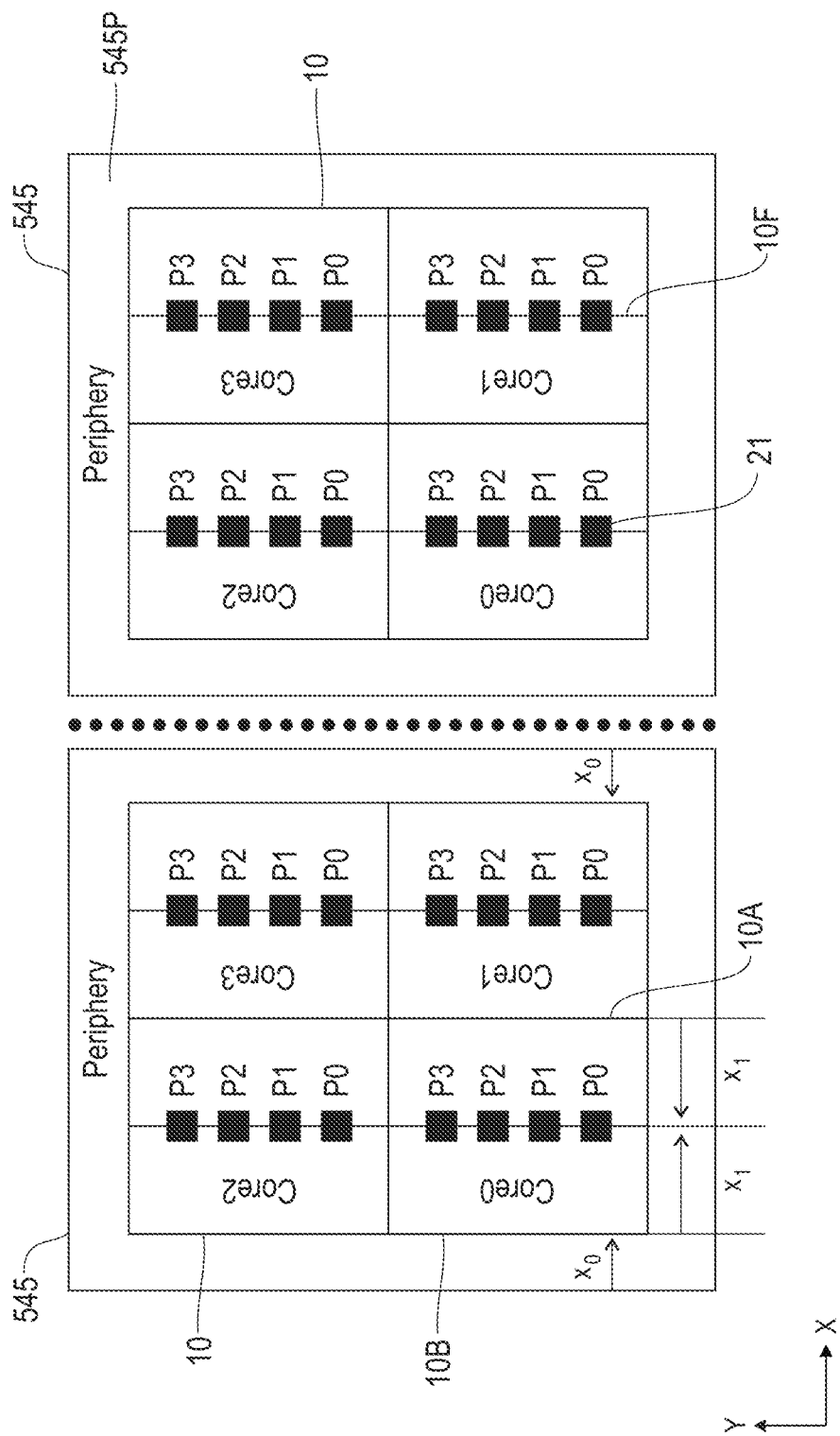
FIG. 18 illustrates core circuits having pads with horizontally symmetrical physical locations, wherein each pad is disposed along a center axis of a core circuit, in accordance with an embodiment of the invention.

FIG. 18 illustrates core circuits 10 having pads 21 with horizontally symmetrical physical locations, wherein each pad 21 is disposed along a center axis 10F of a core circuit 10, in accordance with an embodiment of the invention. As shown in FIG. 18, the pads 21 on each core circuit 10 have horizontally symmetrical physical locations. Specifically, each $i^{th}$ pad disposed along the center axis 10F of each core circuit 10 is arranged such that the distance from the first side 10A of the core circuit 10 to said $i^{th}$ pad is equal to the distance from the second end 10B of the core circuit 10 to said $i^{th}$ pad, wherein in i=0, . . . , Q-1. For example, as shown in FIG. 18, the distance $x_1$ between pad P0 of core circuit Core0 and the first side 10A of core circuit Core0 is equal to the distance $x_1$ between pad P0 of core circuit Core0 and the second side 10B of core circuit Core0.

Since the pads 21 on each core circuit 10 have horizontally symmetrical physical locations, the pads 21 on a first die 545 horizontally aligns with the pads 21 on a second die 545 when the first and second dies 545 are bonded face-to-back, face-to-face, or back-to-back. Furthermore, no mirror-reversing of bus signals is needed when the pads 21 are disposed along the center axis 10F of each core circuit 10, as described above.

Figure 19:
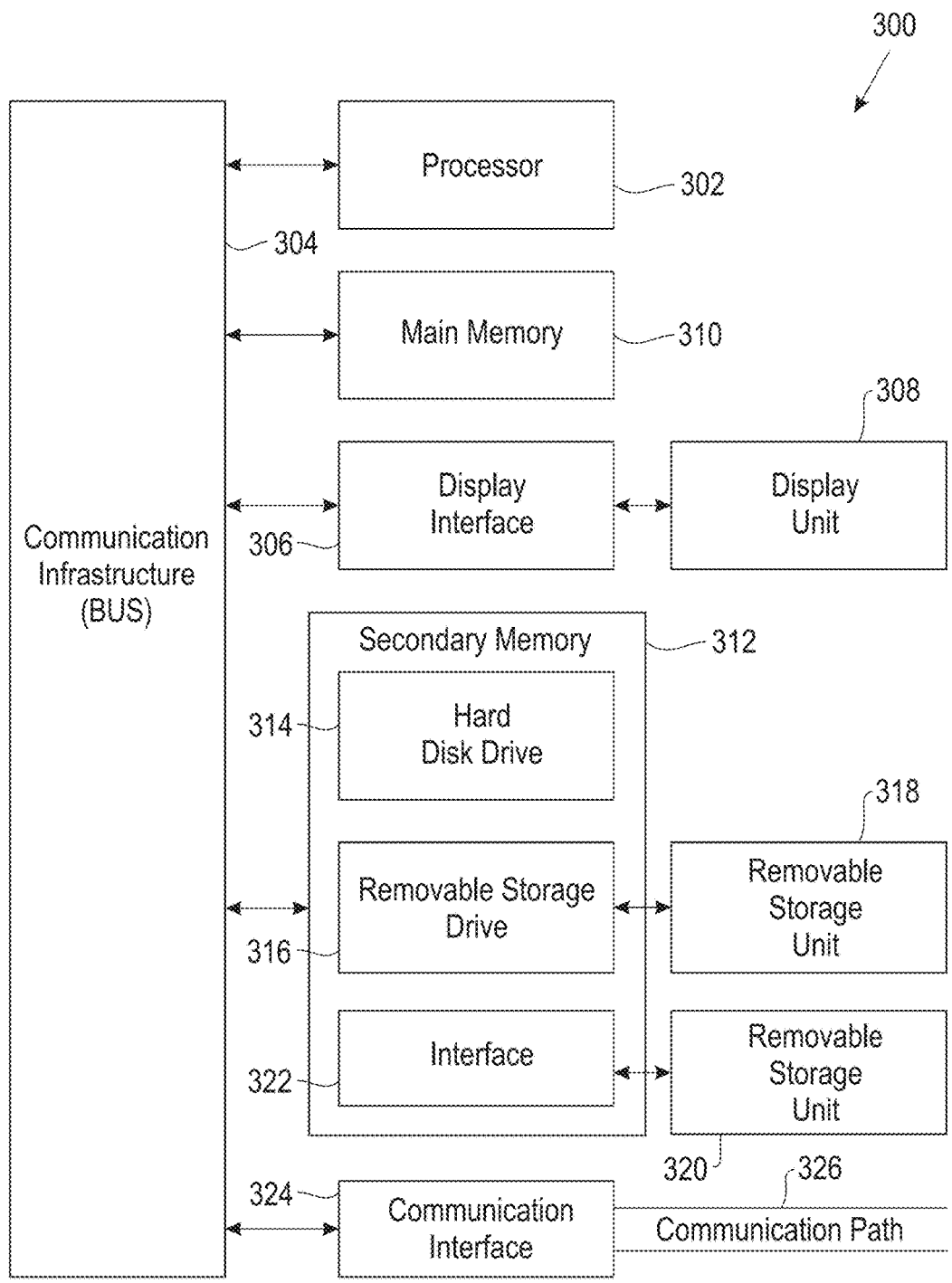
FIG. 19 is a high-level block diagram showing an information processing circuit useful for implementing one embodiment of the invention.

FIG. 19 is a high-level block diagram showing an information processing system 300 useful for implementing one embodiment of the invention. The computer system includes one or more processors, such as processor 302. The processor 302 is connected to a communication infrastructure 304 (e.g., a communications bus, cross-over bar, or network).

The computer system can include a display interface 306 that forwards graphics, text, and other data from the communication infrastructure 304 (or from a frame buffer not shown) for display on a display unit 308. The computer system also includes a main memory 310, preferably random access memory (RAM), and may also include a secondary memory 312. The secondary memory 312 may include, for example, a hard disk drive 314 and/or a removable storage drive 316, representing, for example, a floppy disk drive, a magnetic tape drive, or an optical disk drive. The removable storage drive 316 reads from and/or writes to a removable storage unit 318 in a manner well known to those having ordinary skill in the art. Removable storage unit 318 represents, for example, a floppy disk, a compact disc, a magnetic tape, or an optical disk, etc. which is read by and written to by removable storage drive 316. As will be appreciated, the removable storage unit 318 includes a computer readable medium having stored therein computer software and/or data.

In alternative embodiments, the secondary memory 312 may include other similar means for allowing computer programs or other instructions to be loaded into the computer system. Such means may include, for example, a removable storage unit 320 and an interface 322. Examples of such means may include a program package and package interface (such as that found in video game devices), a removable memory chip (such as an EPROM, or PROM) and associated socket, and other removable storage units 320 and interfaces 322, which allows software and data to be transferred from the removable storage unit 320 to the computer system.

The computer system may also include a communication interface 324. Communication interface 324 allows software and data to be transferred between the computer system and external devices. Examples of communication interface 324 may include a modem, a network interface (such as an Ethernet card), a communication port, or a PCMCIA slot and card, etc. Software and data transferred via communication interface 324 are in the form of signals which may be, for example, electronic, electromagnetic, optical, or other signals capable of being received by communication interface 324. These signals are provided to communication interface 324 via a communication path (i.e., channel) 326. This communication path 326 carries signals and may be implemented using wire or cable, fiber optics, a phone line, a cellular phone link, an RF link, and/or other communication channels.

In this document, the terms "computer program medium," "computer usable medium," and "computer readable medium" are used to generally refer to media such as main memory 310 and secondary memory 312, removable storage drive 316, and a hard disk installed in hard disk drive 314.

Computer programs (also called computer control logic) are stored in main memory 310 and/or secondary memory 312. Computer programs may also be received via communication interface 324. Such computer programs, when run, enable the computer system to perform the features of the present invention as discussed herein. In particular, the computer programs, when run, enable the processor 302 to perform the features of the computer system. Accordingly, such computer programs represent controllers of the computer system.

From the above description, it can be seen that the present invention provides a system, computer program product, non-transitory computer-useable storage medium, and method for implementing the embodiments of the invention. The non-transitory computer-useable storage medium has a computer-readable program, wherein the program upon being processed on a computer causes the computer to implement the steps of the present invention according to the embodiments described herein. References in the claims to an element in the singular is not intended to mean "one and only" unless explicitly so stated, but rather "one or more." All structural and functional equivalents to the elements of the above-described exemplary embodiment that are currently known or later come to be known to those of ordinary skill in the art are intended to be encompassed by the present claims. No claim element herein is to be construed under the provisions of 35 U.S.C. section 112, sixth paragraph, unless the element is expressly recited using the phrase "means for" or "step for."

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A processor array, comprising:
    a plurality of semiconductor dies, wherein each semiconductor die comprises at least one processor core circuit; and
    a plurality of switches, wherein each switch interconnects a processor core circuit of a semiconductor die of the semiconductor dies with at least one other processor core circuit of at least one other semiconductor die of the semiconductor dies, and the switch comprises at least one routing circuit configured to:
        maintain at least one configuration bit indicating whether the processor core circuit and the at least one other processor core circuit have different physical orientations; and
        determine, based on the at least one configuration bit, which of a first set of buses or a second set of buses to select for exchanging packets between the processor core circuit and the at least one other processor core circuit, wherein the second set of buses is selected in response to determining the at least one configuration bit indicates the processor core circuit and the at least one other processor core circuit have different physical orientations, and the second set of buses enables mirror-reversing of packets exchanged between the processor core circuit and the at least one other processor core circuit.

2. The processor array of claim 1, wherein:
    the first set of buses is selected in response to determining the at least one configuration bit indicates the processor core circuit and the at least one other processor core circuit have the same physical orientations;
    the first set of buses comprises straight-through buses for routing packets without mirror-reversing; and
    the second set of buses comprises reversed buses for routing packets with mirror-reversing.

3. The processor array of claim 1, wherein:
    the processor core circuit and the at least one other processor core circuit have different physical orientations if the first semiconductor die and the second semiconductor die are bonded face-to-face or back-to-back; and
    the processor core circuit and the at least one other processor core circuit have the same physical orientations if the first semiconductor die and the second semiconductor die are bonded face-to-back.

4. The processor array of claim 1, wherein the at least one routing circuit implements absolute addressing.

5. The processor array of claim 4, wherein the at least one routing circuit is further configured to:
    determine whether a destination address for the packets is greater than or less than an address of the switch.

6. The processor array of claim 5, wherein the at least one routing circuit is further configured to:
    if mirror-reversing is not enabled:
        route the packets along a first direction in response to determining the destination address is greater than the address of the switch; and
        route the packets along a second direction that is opposite of the first direction in response to determining the destination address is less than the address of the switch.

7. The processor array of claim 6, wherein the at least one routing circuit is further configured to:
    if mirror-reversing is enabled:
        logically reverse direction of the packets by:
            routing the packets along the second direction in response to determining the destination address is greater than the address of the switch; and
            routing the packets along the first direction in response to determining the destination address is less than the address of the switch.

8. The processor array of claim 1, wherein the at least one routing circuit implements relative addressing.

9. The processor array of claim 8, wherein the at least one routing circuit is further configured to:
    determine whether a destination address for the packets is a positive address or a negative address.

10. The processor array of claim 9, wherein the at least one routing circuit is further configured to:
    if mirror-reversing is not enabled:
        route the packets along a first direction in response to determining the destination address is a positive address; and
        route the packets along a second direction that is opposite of the first direction in response to determining the destination address is a negative address.

11. The processor array of claim 10, wherein the at least one routing circuit is further configured to:
    if mirror-reversing is enabled:
        logically reverse direction of the packets by:
            routing the packets along the second direction in response to determining the destination address is a positive direction; and
            routing the packets along the first direction in response to determining the destination address is a negative address.

12. A method, comprising:
    at a routing circuit interconnecting a processor core circuit of a semiconductor die of a processor array with at least one other processor core circuit of at least one other semiconductor die of the processor array:
        maintaining at least one configuration bit indicating whether the processor core circuit and the at least one other processor core circuit have different physical orientations; and determining, based on the at least one configuration bit, which of a first set of buses or a second set of buses to select for exchanging packets between the processor core circuit and the at least one other processor core circuit, wherein the second set of buses is selected in response to determining the at least one configuration bit indicates the processor core circuit and the at least one other processor core circuit have different physical orientations, and the second set of buses enables mirror-reversing of packets exchanged between the processor core circuit and the at least one other processor core circuit.

13. The method of claim 12, wherein:

the first set of buses is selected in response to determining the at least one configuration bit indicates the processor core circuit and the at least one other processor core circuit have the same physical orientations;

the first set of buses comprises straight-through buses for routing packets without mirror-reversing; and the second set of buses comprises reversed buses for routing packets with mirror-reversing.

14. The method of claim 12, wherein:

the processor core circuit and the at least one other processor core circuit have different physical orientations if the first semiconductor die and the second semiconductor die are bonded face-to-face or back-to-back; and the processor core circuit and the at least one other processor core circuit have the same physical orientations if the first semiconductor die and the second semiconductor die are bonded face-to-back.

15. The method of claim 12, wherein the routing circuit implements absolute addressing.

16. The method of claim 15, further comprising:

at the routing circuit:

determining whether a destination address for the packets is greater than or less than an address of the switch.

17. The method of claim 16, further comprising:

at the routing circuit:

if mirror-reversing is not enabled:

routing the packets along a first direction in response to determining the destination address is greater than the address of the switch; and routing the packets along a second direction that is opposite of the first direction in response to determining the destination address is less than the address of the switch; and if mirror-reversing is enabled:

logically reversing direction of the packets by:

routing the packets along the second direction in response to determining the destination address is greater than the address of the switch; and routing the packets along the first direction in response to determining the destination address is less than the address of the switch.

18. The method of claim 12, wherein the routing circuit implements relative addressing.

19. The method of claim 18, further comprising:

at the routing circuit:

determining whether a destination address for the packets is a positive address or a negative address.

20. The method of claim 19, further comprising:

at the routing circuit:

if mirror-reversing is not enabled:

routing the packets along a first direction in response to determining the destination address is a positive address; and routing the packets along a second direction that is opposite of the first direction in response to determining the destination address is a negative address; and if mirror-reversing is enabled:

logically reversing direction of the packets by:

routing the packets along the second direction in response to determining the destination address is a positive direction; and routing the packets along the first direction in response to determining the destination address is a negative address.

* * * * *